US008853087B2

(12) United States Patent
Tanaka et al.

(10) Patent No.: US 8,853,087 B2
(45) Date of Patent: Oct. 7, 2014

(54) METHOD OF MANUFACTURING SEMICONDUCTOR DEVICE AND SYSTEM FOR MANUFACTURING SEMICONDUCTOR DEVICE

(75) Inventors: Keisuke Tanaka, Tokyo (JP); Machi Moriya, Tokyo (JP)

(73) Assignee: Tokyo Electron Limited (JP)

( * ) Notice: Subject to any disclaimer, the term of this patent is extended or adjusted under 35 U.S.C. 154(b) by 93 days.

(21) Appl. No.: 13/518,977

(22) PCT Filed: Dec. 17, 2010

(86) PCT No.: PCT/JP2010/072783
§ 371 (c)(1),
(2), (4) Date: Jul. 16, 2012

(87) PCT Pub. No.: WO2011/078083
PCT Pub. Date: Jun. 30, 2011

(65) Prior Publication Data
US 2012/0282713 A1    Nov. 8, 2012

(30) Foreign Application Priority Data

Dec. 25, 2009    (JP) .................................. 2009-295209

(51) Int. Cl.
| H01L 21/311 | (2006.01) |
| H01L 21/66 | (2006.01) |
| G03F 7/38 | (2006.01) |
| G03F 7/40 | (2006.01) |
| H01L 21/67 | (2006.01) |
| H01L 21/3213 | (2006.01) |
| H01L 21/033 | (2006.01) |

(52) U.S. Cl.
CPC .......... *H01L 21/67184* (2013.01); *H01L 22/12* (2013.01); *H01L 21/32139* (2013.01);
(Continued)

(58) Field of Classification Search
CPC ..................... G03F 7/70625; G03F 7/70633
USPC .................. 438/947, 401, 696; 257/E21.039, 257/E21.257, E21.236, E21.53; 346/400, 346/401, 369, 399, 625; 702/127; 382/144, 382/151; 700/121; 356/400, 401, 369, 399, 356/625; 430/314

See application file for complete search history.

(56) References Cited

U.S. PATENT DOCUMENTS 6,433,878 B1 *   8/2002   Niu et al. .................... 356/603
6,772,084 B2 *   8/2004   Bischoff et al. .............. 702/127
(Continued)

FOREIGN PATENT DOCUMENTS

| JP | 64035916 | 2/1989 |
| JP | 2005033187 | 2/2005 |

(Continued)

OTHER PUBLICATIONS

Dasari et al., "Diffraction Based Overlay Metrology for Double Patterning Technologies", Proc. SPIE 7272, Metrology, Inspection, and Process Control for Microlithography XXIII, 727212 (Mar. 24, 2009).*

(Continued)

*Primary Examiner* — Marvin Payen
*Assistant Examiner* — Victor Barzykin
(74) *Attorney, Agent, or Firm* — Cantor Colburn LLP

(57) ABSTRACT

A target space ratio of a monitor pattern on a substrate for inspection is determined to be different from a ratio of 1:1. A range of space ratios in a library is determined to include the target space ratio and not include a space ratio of 1:1. The monitor pattern is formed on a film to be processed by performing predetermined processes on the substrate for inspection. Sizes of the monitor pattern are measured. The sizes of the monitor pattern are converted into sizes of a pattern of the film to be processed having a space ratio of 1:1, and processing conditions of the predetermined processes are compensated for based on the sizes of the converted pattern of the film to be processed. After that, the predetermined processes are performed on a wafer under the compensated conditions to form a pattern having a space ratio of 1:1 on the film to be processed.

17 Claims, 23 Drawing Sheets

(52) U.S. Cl.
CPC .. *G03F 7/38* (2013.01); *G03F 7/40* (2013.01); *H01L 22/20* (2013.01); *H01L 21/32137* (2013.01); *H01L 21/0337* (2013.01); *H01L 21/67178* (2013.01); *Y10S 438/947* (2013.01)
USPC .... 438/696; 438/401; 438/947; 257/E21.039; 257/E21.257; 257/E21.236; 257/E21.53; 356/400; 356/401; 356/369; 356/399; 356/625; 700/121; 702/127; 382/144; 382/151; 430/314

(56) References Cited

U.S. PATENT DOCUMENTS

| | | | | |
|---|---|---|---|---|
| 6,804,005 | B2* | 10/2004 | Bischoff et al. | 356/369 |
| 6,856,408 | B2 | 2/2005 | Raymond | |
| 6,947,141 | B2* | 9/2005 | Bischoff et al. | 356/369 |
| 7,312,860 | B2* | 12/2007 | Den Boef et al. | 356/124 |
| 7,386,162 | B1* | 6/2008 | Dakshina-Murthy et al. | 382/144 |
| 7,396,781 | B2* | 7/2008 | Wells | 438/448 |
| 7,656,512 | B2* | 2/2010 | Mieher et al. | 356/125 |
| 7,663,753 | B2* | 2/2010 | Mieher et al. | 356/401 |
| 7,695,876 | B2* | 4/2010 | Ye et al. | 430/30 |
| 7,911,612 | B2* | 3/2011 | Kiers et al. | 356/399 |
| 7,935,965 | B1* | 5/2011 | Brozek | 257/48 |
| 8,250,497 | B2* | 8/2012 | Hsu et al. | 716/55 |
| 2003/0215724 | A1 | 11/2003 | Asano et al. | |
| 2004/0260420 | A1* | 12/2004 | Ohno et al. | 700/121 |
| 2005/0037271 | A1 | 2/2005 | Shishido et al. | |
| 2005/0209816 | A1 | 9/2005 | Vuong et al. | |
| 2005/0227618 | A1 | 10/2005 | Karabinis et al. | |
| 2006/0187466 | A1 | 8/2006 | Li et al. | |
| 2006/0281266 | A1* | 12/2006 | Wells | 438/299 |
| 2007/0201043 | A1 | 8/2007 | Raymond | |
| 2007/0222979 | A1* | 9/2007 | Van Der Laan et al. | 356/243.1 |
| 2007/0224518 | A1 | 9/2007 | Yokhin et al. | |
| 2008/0076070 | A1* | 3/2008 | Koh et al. | 430/311 |
| 2008/0122125 | A1* | 5/2008 | Zhou | 257/797 |
| 2008/0192221 | A1* | 8/2008 | Mieher et al. | 355/55 |
| 2008/0285054 | A1 | 11/2008 | Vuong et al. | |
| 2008/0311344 | A1* | 12/2008 | Kiers et al. | 428/138 |
| 2009/0225285 | A1 | 9/2009 | Otsuka | |
| 2009/0291399 | A1* | 11/2009 | Yamamoto | 430/324 |
| 2011/0141450 | A1* | 6/2011 | Megens et al. | 355/75 |
| 2012/0033223 | A1* | 2/2012 | Leewis et al. | 356/446 |

FOREIGN PATENT DOCUMENTS

| | | |
|---|---|---|
| JP | 2008530579 | 8/2008 |
| JP | 2009099938 | 5/2009 |
| KR | 20030077465 | 10/2003 |
| KR | 1020090096332 | 9/2009 |

OTHER PUBLICATIONS

International Search Report—PCT/JP2010/072783 dated Mar. 15, 2011.

* cited by examiner

US 8,853,087 B2

METHOD OF MANUFACTURING SEMICONDUCTOR DEVICE AND SYSTEM FOR MANUFACTURING SEMICONDUCTOR DEVICE

TECHNICAL FIELD

The present invention relates to a method of manufacturing a semiconductor device by forming a predetermined pattern on a film to be processed on a substrate, for example, a semiconductor wafer or the like, and a system for manufacturing a semiconductor device.

BACKGROUND ART

According to conventional semiconductor device manufacturing processes, a photolithography process sequentially performing a resist applying process of forming a resist film by applying a resist liquid on a semiconductor wafer (hereinafter, referred to as "wafer"), an exposure process of exposing a predetermined pattern on the corresponding resist film, and a developing process of developing the exposed resist film is performed such that a predetermined resist pattern may be formed on the wafer. By using the resist pattern as a mask, an etching process of a film to be processed on the wafer is performed, and after that, the resist film is removed and a predetermined pattern is formed on the film to be processed.

When forming the pattern of the film to be processed that is described above, fine patterns are required to be formed on the corresponding film to be processed in order to achieve high integration of a semiconductor device. In general, a limitation in miniaturization in the photolithography process is about a wavelength of light used in the exposure process. Thus, wavelength of the light used in the exposure process has been narrowed, according to the conventional art. However, there are technical and economical limitations in narrowing the wavelength of an exposure light source, and it is difficult to form fine patterns of, for example, a few nano-meter order, on a surface of the film to be processed only by narrowing the wavelength of the light.

Therefore, a so-called side wall transfer (SWT) method, in which a mask is formed on opposite side wall portions of line portions in the resist pattern by using a $SiO_2$ film as a sacrificial film, has been suggested. The SWT method performs a patterning of the film to be processed to be finer pitches than those of the resist pattern that is formed on the wafer by performing the photolithography process at an initial stage. That is, according to the SWT method, a sacrificial film is formed on the resist pattern, and the sacrificial film is etched so as to remain only on side wall portions of line portions in the resist pattern. After that, the resist pattern is removed, and a pattern of the sacrificial film is formed on the film to be processed of the wafer. Then, the film to be processed is etched by using the fine sacrificial film pattern as a mask, so that fine patterns of the film to be processed are formed on the wafer (Patent Reference 1).

In addition, in order to obtain higher integration of the semiconductor device as described above, sizes of structures on the wafer, that is, patterns of the sacrificial film or the film to be processed, have to be measured exactly when manufacturing the semiconductor device. In addition, a result of the measurement is applied to processing conditions of the wafer, and thus, the wafer may be appropriately processed and a high throughput may be realized.

Conventionally, in order to measure sizes or shapes of the patterns formed on the wafer, a method of observing the patterns with a scanning electron microscope has been used. However, according to the conventional method using the scanning electron microscope, a vacuum apparatus is necessary, and the wafer has to be cleaved, that is, the wafer itself has to be damaged, in order to measure a cross-section of the wafer for measuring a three-dimensional shape such as a height of the pattern or the like.

Therefore, a scatterometry method has been suggested in order to nondestructively measure sizes of patterns formed on the wafer exactly and rapidly. According to the scatterometry method, a diffracted light beam (spectrum) generated when a light beam is irradiated onto an arbitrary repeated pattern shape is calculated to generate library thereof in advance. In addition, a light beam is irradiated onto an actual pattern that is an object to be measured, and a spectrum of light reflected from the pattern is measured. The measurement result and spectrum of the library are matched so as to estimate a pattern shape of an appropriate spectrum in the library as the actual pattern shape. By using the above method, even when the patterns formed on the wafer are fine, a size of a predetermined pattern on the wafer can be measured through the pattern matching by using the library (Patent Reference 2).

PRIOR ART REFERENCE (Patent Reference 1) . . . Japanese Laid-open Patent Publication No. 2009-99938

(Patent Reference 2) . . . Japanese Laid-open Patent Publication No. 2005-33187

DISCLOSURE OF THE INVENTION

Technical Problem

However, it is required to form a pattern of a film to be processed on a wafer to have a first space portion and a second space portion adjacent to the first space portion, widths of which have a ratio of 1:1. Therefore, according to the above described SWT method, it is required to form a pattern 901 of a sacrificial film formed on a film to be processed 900 of a wafer W shown in FIG. 17 such that a space ratio between a width $D_1$ of a first space portion 903a between line portions 902a and 902b and a width $D_2$ of a second space portion 903b between the line portions 902b and 902a is 1:1. In addition, the first space portion 903a is a space formed by removing a resist pattern 904, and the second space portion 903b is a space formed between two resist patterns 904.

However, when the SWT method is used, one line portion 902b between the two line portions 902a and 902b of the sacrificial film pattern 901 may be dislocated from a predetermined position, as shown in FIG. 18. That is, the space ratio of the sacrificial film pattern 901 may not be 1:1.

In this case, a degree of the dislocation of the line portion 902b in the sacrificial film pattern 901 has to be exactly measured. However, when the scatterometry method is used in this measurement, so-called toggling phenomenon may occur.

As described above, according to the scatterometry method, a library with respect to an arbitrary pattern is used. FIG. 19 is a graph showing a range of a space ratio (diagonal line portion in FIG. 19) of a library L. The library L includes a spectrum $E_1$ of the pattern having a space ratio which is aimed to be of 1:1. In this case, when assuming that the actual space ratio shown in FIG. 18 is 0.8:1.2, a spectrum $E_2$ is obtained by irradiating light beam on a pattern 501 as shown in FIG. 19. However, the spectrum $E_2$ has the same distribution as that of a spectrum $E_3$ having a space ratio of 1.2:0.8. That is, spectrums having the space ratios that are located point-symmetrically with each other with respect to the space ratio of 1:1 have the same distribution. Then, when matching the measured spectrum $E_2$ with the spectrums in the library L, the spectrum $E_3$ may be wrongly estimated as the actual spectrum $E_2$. That is, even though the actual space ratio is 0.8:1.2, it can be estimated that the space ratio of the pattern is 1.2:0.8. This is referred to as the above described toggling.

In addition, the space ratio 1.2:0.8 of the spectrum $E_3$ denotes that a ratio between the width $D_1$ of the first space portion 903*a* and a width $D_2$ of the second space portion 903*b* is 1.2:0.8 as shown in FIG. 20. Therefore, the pattern 901 shown in FIG. 20, which is measured by the scatterometry method, is totally different from the actual pattern 901 shown in FIG. 18.

As described above, when the toggling occurs, the sacrificial film pattern 901 is estimated to be different from the actual pattern, and thus, sizes of the sacrificial film pattern 901 cannot be measured exactly.

In addition, when the pattern of the film to be processed formed on the wafer is measured, sizes of the pattern of the film to be processed may not be measured exactly, as described above.

To address the above problems, the present invention is to form a pattern having a space ratio of 1:1 on a film to be processed on a substrate, by exactly measuring sizes of a sacrificial film pattern or a pattern of a film to be processed on the substrate.

Technical Solution

According to an aspect of the present invention, there is provided a method of manufacturing a semiconductor device by performing predetermine processes on a substrate to form a pattern including line portions and space portions and having a space ratio of 1:1 between a width of a first space portion and a width of a second space portion that is adjacent to the first space portion on a film to be processed on the substrate, wherein the predetermined processes may include: a resist pattern forming process of forming a resist pattern formed as a plurality of lines on the film to be processed on the substrate, by performing a photolithography process on the substrate; a trimming process of trimming the resist pattern; a film forming process of forming a sacrificial film that is a mask used when etching the film to be processed on the resist pattern; a sacrificial film pattern forming process of forming a pattern of the sacrificial film on the film to be processed on the wafer, wherein the pattern may include a plurality of lines, by etching the sacrificial film so as to have the sacrificial film remain only on side wall portions of line portions of the resist pattern, and by removing the resist pattern; a film to be processed pattern forming process of forming the pattern including a plurality of lines on the film to be processed, by etching the film to be processed by using the sacrificial film pattern as a mask; a monitor pattern forming process of forming a first monitor pattern formed on a sacrificial film of a substrate for inspection in the sacrificial film pattern forming process and forming a second monitor pattern formed on a film to be processed on the substrate for inspection in the film to be processed pattern forming process by performing predetermined processes on the substrate for inspection, wherein target space ratios of the first and second monitor patterns are different from a ratio of 1:1; a size measuring process of measuring sizes of the first monitor pattern or the second monitor pattern formed in the monitor pattern forming process, in a scatterometry method by using a library including sacrificial film patterns and patterns of the film to be processed, wherein a range of space ratios of the library includes the target space ratio and does not include the space ratio of 1:1; a ratio converting process of converting the sizes of the first or second monitor pattern, which are measured through the size measuring process, into sizes of a sacrificial film pattern or a pattern of a film to be processed, a space ratio of which is aimed to be 1:1, by using a regression equation for converting the sizes of the first monitor pattern or the second monitor pattern having the target space ratio into sizes of a sacrificial film pattern or a pattern of a film to be processed having a space ratio of 1:1; a processing condition compensation process of compensating for processing conditions in the predetermined processes, based on the sizes of the sacrificial film pattern or the pattern of the film to be processed converted in the ratio converting process; and a substrate processing process of forming a pattern having a space ratio of 1:1 on the film to be processed on the substrate, by performing the predetermined processes on the substrate under the compensated processing conditions. Also, the sacrificial film may be, for example, a $SiO_2$ film. Also, sizes of the pattern may denote, for example, a line width of the line portion, the width of the space portion, and side wall angle of the line portion in the pattern.

According to the present invention, the first monitor pattern or the second monitor pattern (hereinafter, sometimes simply referred to as 'monitor pattern') is formed on the substrate for inspection by performing predetermined processes, and the sizes of the monitor pattern are measured by using the scatterometry method. Here, the target space ratio of the monitor pattern may be different from a ratio of 1:1. In addition, when measuring the sizes of the monitor pattern, a range of space ratios of the library used in the scatterometry method may include the target space ratio, but does not include the space ratio of 1:1. That is, the library does not include a space ratio that is located at a point symmetric location with respect to the space ratio of 1:1, but includes spectrums of different distributions. Therefore, according to the present invention, the sizes of the monitor pattern may be measured exactly without occurring a toggling, like in the conventional art. After that, the measured sizes of the monitor pattern are converted into sizes of the pattern of the sacrificial film or the pattern of the film to be processed, the space ratio of which is aimed to be 1:1, by using a regression equation that is stored in advance to compensate for processing conditions of the predetermined processes. Therefore, the predetermined processes may be performed on the substrate under the compensated processing conditions, and thus the pattern having a space ratio of 1:1 may be appropriately formed on the film to be processed on the substrate.

According to another aspect of the present invention, there is provided a method of manufacturing a semiconductor device by performing predetermine processes on a substrate to form a pattern including line portions and space portions and having a space ratio of 1:1 between a width of a first space portion and a width of a second space portion that is adjacent to the first space portion on a film to be processed on the substrate, the method including: a monitor pattern forming process of forming a monitor pattern, a target space ratio of which is different from a ratio of 1:1, by performing the predetermined processes on a substrate for inspection; a size measuring process of measuring sizes of the monitor pattern formed in the monitor pattern forming process, in a scatterometry method by using a library including patterns, wherein a range of space ratios of the library includes the target space ratio and does not include the space ratio of 1:1; a ratio converting process of converting the sizes of the monitor pattern, which are measured through the size measuring process, into sizes of a pattern, a space ratio of which is aimed to be 1:1, by using a regression equation for converting the sizes of the monitor pattern having the target space ratio into sizes of a pattern having a space ratio of 1:1; a processing condition compensation process of compensating for processing conditions in the predetermined processes, based on the sizes of the pattern converted in the ratio converting process; and a substrate processing process of forming a pattern having a space ratio of 1:1 on the film to be processed on the substrate, by performing the predetermined processes on the substrate under the compensated processing conditions.

According to another aspect of the present invention, there is provided a system for manufacturing a semiconductor device by performing predetermine processes on a substrate to form a pattern including line portions and space portions and having a space ratio of 1:1 between a width of a first space portion and a width of a second space portion that is adjacent to the first space portion on a film to be processed on the substrate, the system including: a processing unit including an applying and developing device and an exposure device which form a resist pattern including a plurality of lines on the film to be processed on the substrate by performing a photolithography process on the substrate, a trimming device which trims the resist pattern, a film forming device which forms a sacrificial film that functions as a mask when etching the film to be processed on the resist pattern, an ashing device which forms a pattern of the sacrificial film on the film to be processed on the substrate, wherein the pattern comprises a plurality of lines, by etching the sacrificial film so as to have the sacrificial film remain only on side wall portions of line portions of the resist pattern, and by removing the resist pattern, and an etching device which form a pattern including a plurality of lines on the film to be processed by etching the film to be processed by using the pattern of the sacrificial film as a mask, and performing the predetermined processes on the substrate; a pattern size measuring device which measures sizes of the pattern of the sacrificial film or the pattern of the film to be processed; a controlling device which compensates for processing conditions in the processing unit based on a result of measuring the sizes of the pattern of the sacrificial film or the pattern of the film to be processed, wherein the controlling device controls the processing unit to form a first monitor pattern formed on a sacrificial film of a substrate for inspection by the film forming device and to form a second monitor pattern formed on a film to be processed on the substrate for inspection by the etching device by performing predetermined processes on the substrate for inspection, wherein target space ratios of the first and second monitor patterns are different from a ratio of 1:1; controls the pattern size measuring device to measure sizes of the first monitor pattern or the second monitor pattern formed in the processing unit, in a scatterometry method by using a library including sacrificial film patterns or patterns of the film to be processed, wherein a range of space rations of the library includes the target space ratio and does not include the space ratio of 1:1; converts the sizes of the first or second monitor pattern of the target space ratio, which are measured by the pattern size measuring device, into sizes of a sacrificial film pattern or a pattern of a film to be processed, a space ratio of which is aimed to be 1:1, by using a regression equation for converting the sizes of the first monitor pattern or the second monitor pattern having the target space ratio into sizes of a sacrificial film pattern or a pattern of a film to be processed having a space ratio of 1:1; and compensates for processing conditions in the processing unit based on the sizes of the converted sacrificial film pattern or the pattern of the film to be processed.

According to another aspect of the present invention, there is provided a system for manufacturing a semiconductor device by performing predetermine processes on a substrate to form a pattern including line portions and space portions and having a space ratio of 1:1 between a width of a first space portion and a width of a second space portion that is adjacent to the first space portion on a film to be processed on the substrate, the system including: a processing unit which forms a pattern by performing the predetermined processes on a substrate; a pattern size measuring device which measures sizes of the pattern formed by the processing unit; and a controlling device which compensates for processing conditions in the processing unit based on a result of measuring the sizes of the pattern, wherein the controlling device controls the processing unit to form a monitor pattern, a target space ratio of which is different from a ratio of 1:1, by performing the predetermined processes on a substrate for inspection; controls the pattern size measuring device to measure sizes of the monitor pattern formed by the processing unit, in a scatterometry method by using a library including patterns, wherein a range of space ratios of the library includes the target space ratio and does not include the space ratio of 1:1; converts the sizes of the monitor pattern, which are measured by the pattern size measuring device, into sizes of a pattern, a space ratio of which is aimed to be 1:1, by using a regression equation for converting the sizes of the monitor pattern having the target space ratio into sizes of a pattern having a space ratio of 1:1; and compensates for processing conditions in the processing unit, based on the sizes of the pattern converted in the ratio converting process.

Advantageous Effects

According to the present invention, a pattern having a space ratio of 1:1 may be appropriately formed on a film to be processed on a substrate to have predetermined sizes, by exactly measuring sizes of a sacrificial film pattern or a pattern of a film to be processed on the substrate.

BRIEF DESCRIPTION OF THE DRAWINGS

FIGS. 14A through 14E are diagrams showing states of a wafer for inspection in each of processes, wherein FIG. 14A shows that a resist pattern is formed, FIG. 14B shows that the resist pattern and an anti-reflection film are trimmed, FIG. 14C shows that a sacrificial film is formed, FIG. 14D shows that a pattern (monitor pattern) of the sacrificial film is formed, and FIG. 14E shows that a pattern (monitor pattern) of a film to be processed is formed;

FIGS. 15A through 15E are diagrams showing states of a wafer in each of processes, wherein FIG. 15A shows that a resist pattern is formed, FIG. 15B shows that the resist pattern and an anti-reflection film are trimmed, FIG. 15C shows that a sacrificial film is formed, FIG. 15D shows that a pattern of the sacrificial film is formed, and FIG. 15E shows that a pattern of a film to be processed is formed;

FIGS. 16A and 16B are diagrams showing patterns of a film to be processed, which have different ratios between line widths of line portions and widths of space portions from each other, formed on the wafer, wherein FIG. 16A shows a pattern of a film to be processed, in which the ratio between the line width of the line portion and the width of the space portion is 1:1, and FIG. 16B shows a pattern of a film to be processed, in which a ratio between the line width of the line portion and the width of the space portion is 1:3;

BEST MODE FOR CARRYING OUT THE INVENTION

Figure 1:
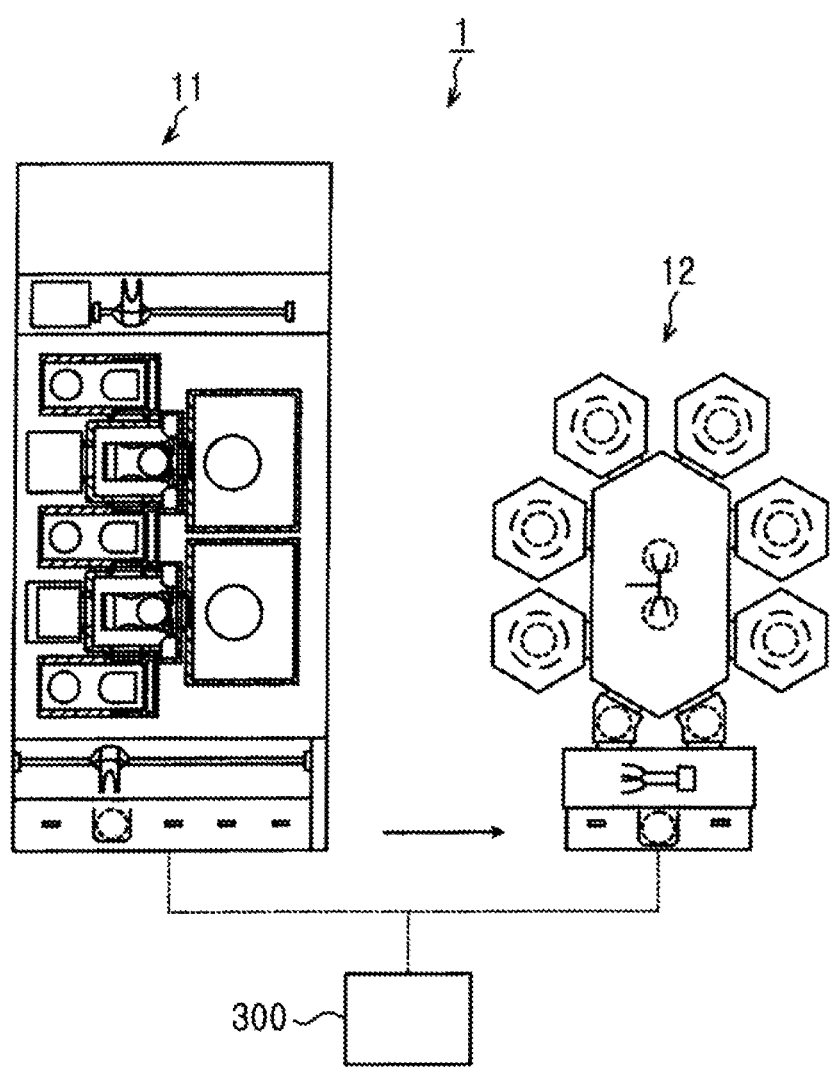
FIG. 1 is a schematic plan view showing a system for manufacturing a semiconductor device according to an embodiment of the present invention.

Hereinafter, embodiments of the present invention will be described. FIG. 1 is a plan view schematically showing a system 1 for manufacturing a semiconductor device according to an embodiment of the present invention. Also, according to the present embodiment, a pattern of a film to be processed is formed on a wafer W by using a side wall transfer (SWT) method. In addition, the pattern of the film to be processed includes line portions and space portions, and a space ratio between a width of a first space portion and a width of a second space portion that is adjacent to the first space portion is 1:1.

The system 1 for manufacturing the semiconductor device includes a first processing unit 11 and a second processing unit 12 which are performing predetermined processes on a wafer W as shown in FIG. 1.

The first processing unit 11 includes an applying and developing device 20 and an exposure device 21 which are performing a photolithography on the wafer W.

Figure 2:
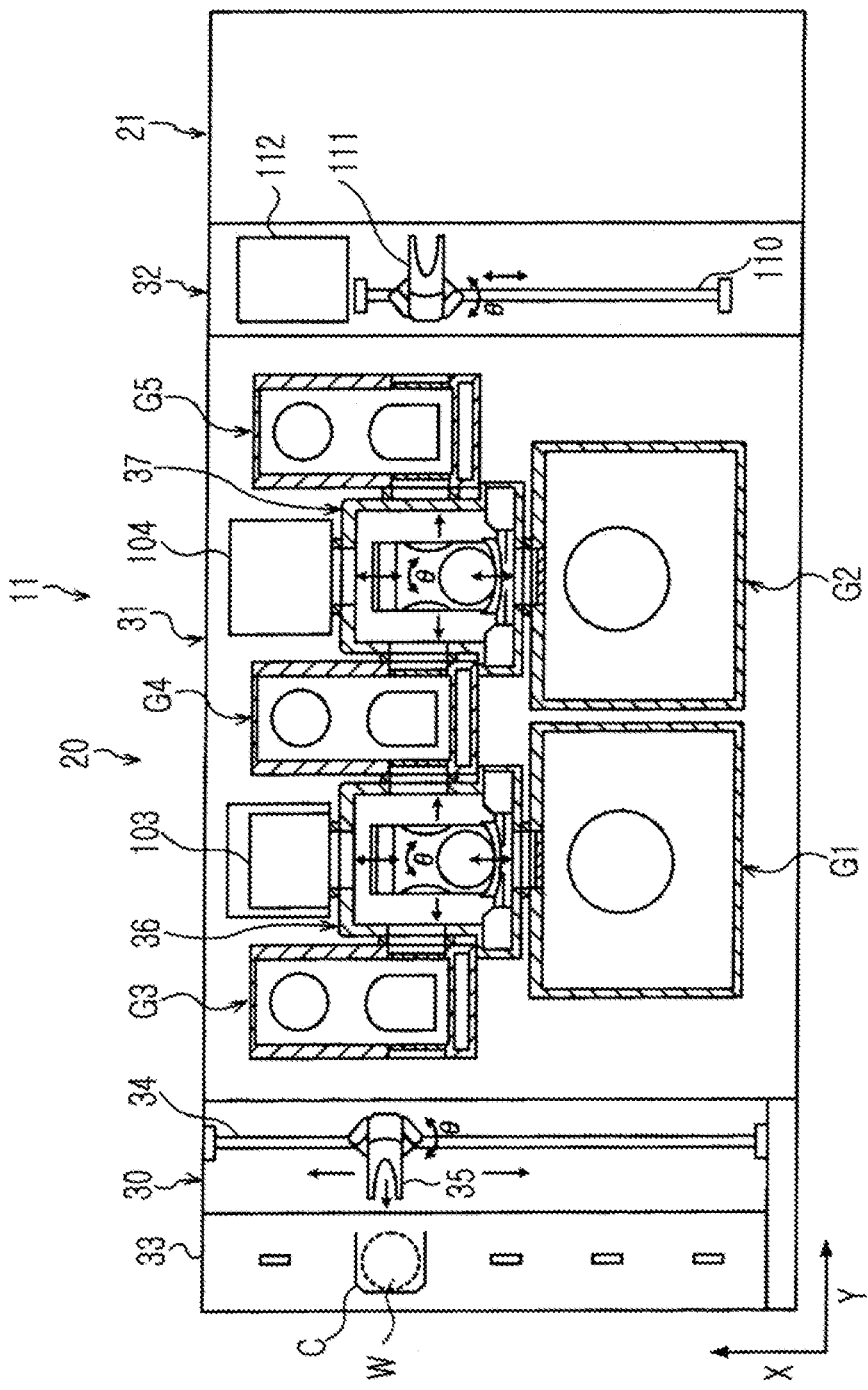
FIG. 2 is a schematic plan view showing a configuration of a first processing unit.

The applying and developing device 20, as shown in FIG. 2, has a structure including a cassette station 30 carrying in/out the wafers W, for example, 25 wafers W, into/from the applying and developing device 20 from outside in a cassette unit, or carrying in/out the wafers W into/from the cassette C, a processing station 31 in which a plurality of various processing devices performing predetermined processes during the photolithography process in a single type are arranged in multiple stages, and an interface station 32 delivering the wafers W between the processing station 31 and the exposure device 21 that is provided to be adjacent to the processing station 31, wherein the cassette station 30, the processing station 31, and the interface station 32 are integrally connected to each other.

In the cassette station 30, a cassette holding stage 33 is provided, and a plurality of cassettes C may be freely held in a row in an X-axis direction (up-and-down direction in FIG. 2) by the cassette holding stage 33. In the cassette station 30, a wafer transfer body 35 that is capable of moving on a transfer path 34 in the X-axis direction is provided. The wafer transfer body 35 freely moves in a direction (Z-axis direction; vertical direction) in which the wafers W accommodated in the cassette C are arranged, and may selectively access the wafer W in each of the cassettes C that are arranged in the X-axis direction.

The wafer transfer body 35 may rotate in a θ direction around a Z-axis, and may access a temperature adjusting device 70 included in a third processing device group G3 at the processing station 31 side, which will be described later, or a transition device 71 for delivering the wafer W.

The processing station 31 adjacent to the cassette station 30 includes, for example, five processing device groups G1 through G5, in which a plurality of processing devices are arranged in multiple stages. At a negative direction of the X-axis direction (lower portion of FIG. 2) in the processing station 31, a first processing device group G1 and a second processing device group G2 are sequentially disposed from the cassette station 30 side. A third processing device group G3, a fourth processing device group G4, and a fifth processing device group G5 are sequentially disposed from the cassette station 30 side at a positive direction of the X-axis direction (upper portion of FIG. 2) of the processing station 31. A first transfer device 36 is provided between the third processing device group G3 and the fourth processing device group G4. The first transfer device 36 may transfer the wafer W by selectively accessing each of processing devices in the first processing device group G1, the third processing device group G3, and the fourth processing device group G4. A second transfer device 37 is provided between the fourth processing device group G4 and the fifth processing device group G5. The second transfer device 37 may transfer the wafer W by selectively accessing each of the processing devices in the second processing device group G2, the fourth processing device group G4, and the fifth processing device group G5.

Figure 3:
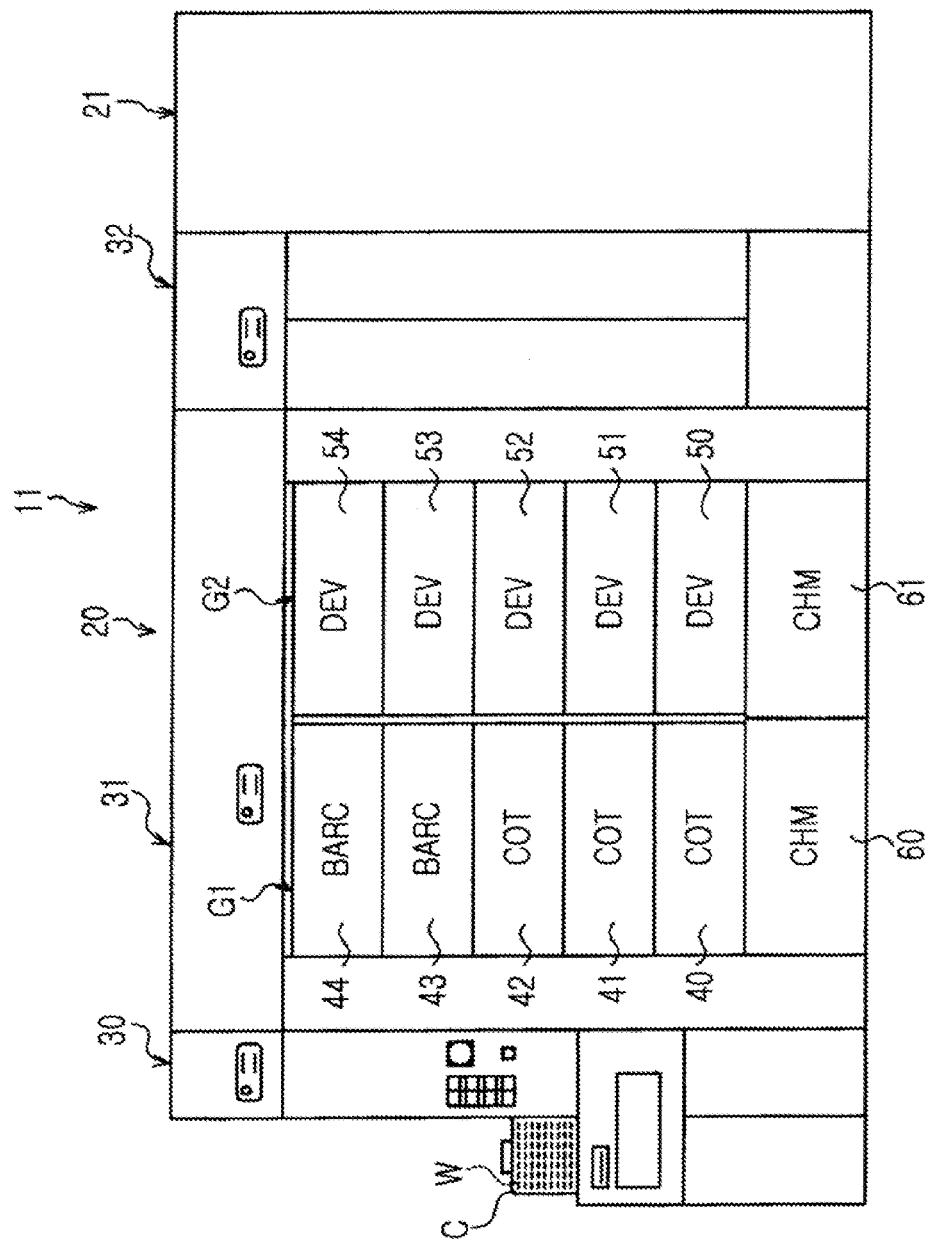
FIG. 3 is a front view of the first processing unit.

As shown in FIG. 3, the first processing device group G1 includes liquid processing devices performing processes by supplying a predetermined liquid to the wafer W, for example, resist application devices 40, 41, and 42 applying a resist liquid on the wafer W, and bottom coating devices 43 and 44 forming an anti-reflection film for preventing light from being reflected during an exposure process, which are sequentially arranged in five stages from a lower portion. The second processing device group G2 includes liquid processing devices, for example, development processing devices 50 through 54 performing a developing process by supplying a developing liquid to the wafer W, which are sequentially arranged in five stages from a lower portion. In addition, chemical chambers 60 and 61 for providing the liquid processing devices of the processing device groups G1 and G2 with various processing liquids are respectively provided at the lowermost stages in the first processing device group G1 and the second processing device group G2.

Figure 4:
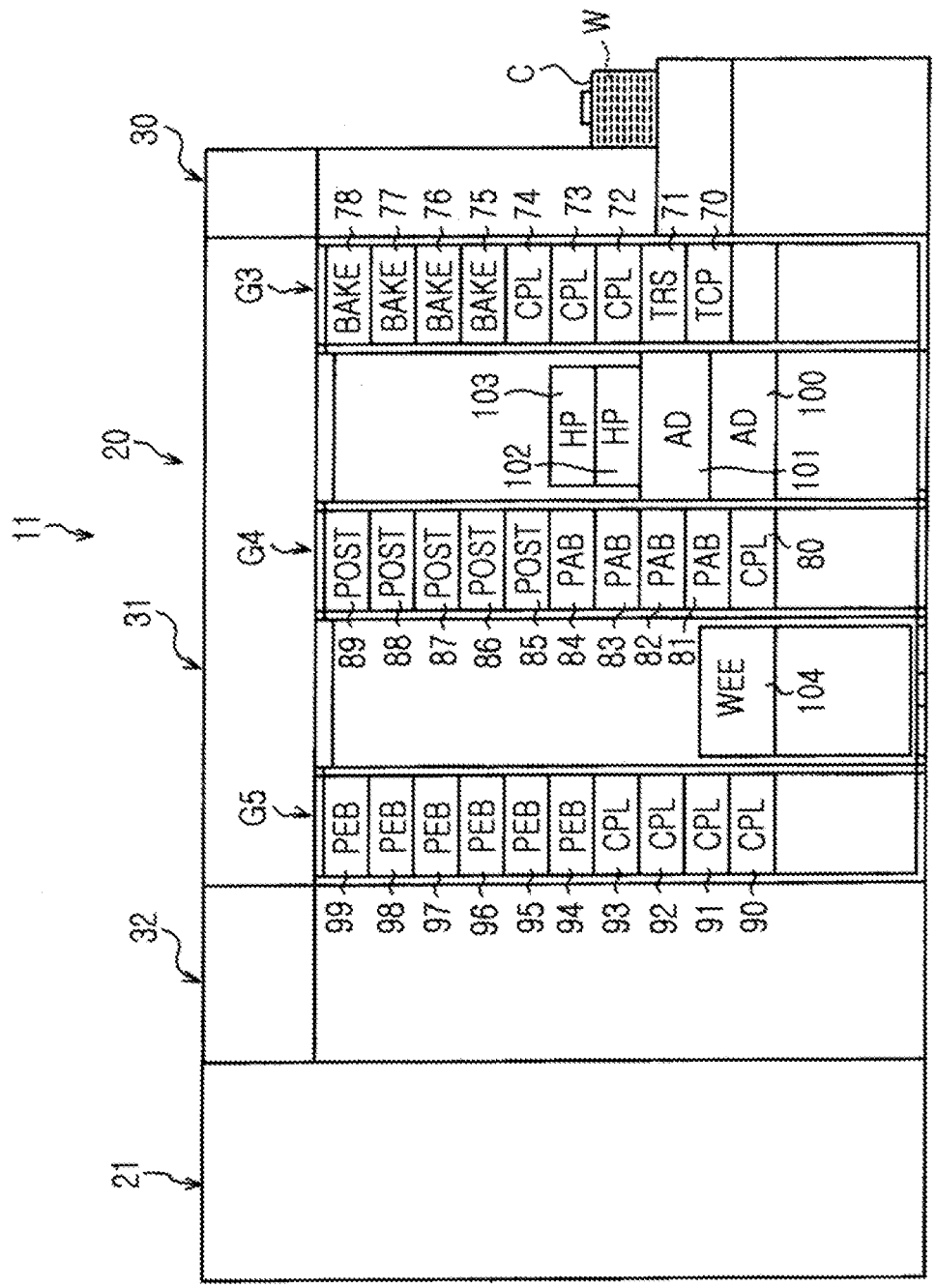
FIG. 4 is a rear view of the first processing unit.

As shown in FIG. 4, the third processing device group G3 includes a temperature adjusting device 70, a transition device 71, high precision temperature adjusting devices 72 through 74 adjusting a temperature of the wafer W under a high precision temperature management, and high temperature heat processing devices 75 through 78 for heating the wafer W to be a high temperature, which are sequentially stacked in nine stages from a lower portion.

The fourth processing device group G4 includes, for example, a high precision temperature adjusting device 80, pre-baking devices 81 through 84 (hereinafter, referred to as PAB devices) for heating the wafer W on which the resist is applied, and post-baking devices 85 through 89 (hereinafter, referred to as POST devices) heating the wafer W after the developing process, which are sequentially stacked in ten stages from a lower portion.

The fifth processing device group G5 includes a plurality of thermal processing devices for performing a thermal process on the wafer W, for example, high precision temperature adjusting devices 90 through 93, post exposure baking devices 94 through 99 (hereinafter, referred to as PEB devices) heating the wafer W after the exposure process, which are sequentially stacked in ten stages from a lower portion.

As shown in FIG. 2, a plurality of processing devices are disposed at a positive side of the X-axis direction of the first transfer device 36, and as shown in FIG. 4, adhesion devices 100 and 101 for hydrophobing the wafer W, and heating devices 102 and 103 for heating the wafer W are sequentially stacked in four stages from a lower portion. As shown in FIG. 2, for example, a peripheral exposure device 104 that selectively exposes only an edge portion of the wafer W is disposed at a positive X-axis direction side of the second transfer device 37.

As shown in FIG. 2, a wafer transfer device 111 moving on a transfer path 110 that is elongated in the X-axis direction as shown in FIG. 2, and a buffer cassette 112 are provided in the interface station 32. The wafer transfer body 111 may move in a Z-axis direction and may rotate in a θ direction, and may transfer the wafer W by accessing the exposure device 21 that is adjacent to the interface station 32, the buffer cassette 112, and the fifth processing device group G5.

Figure 5:
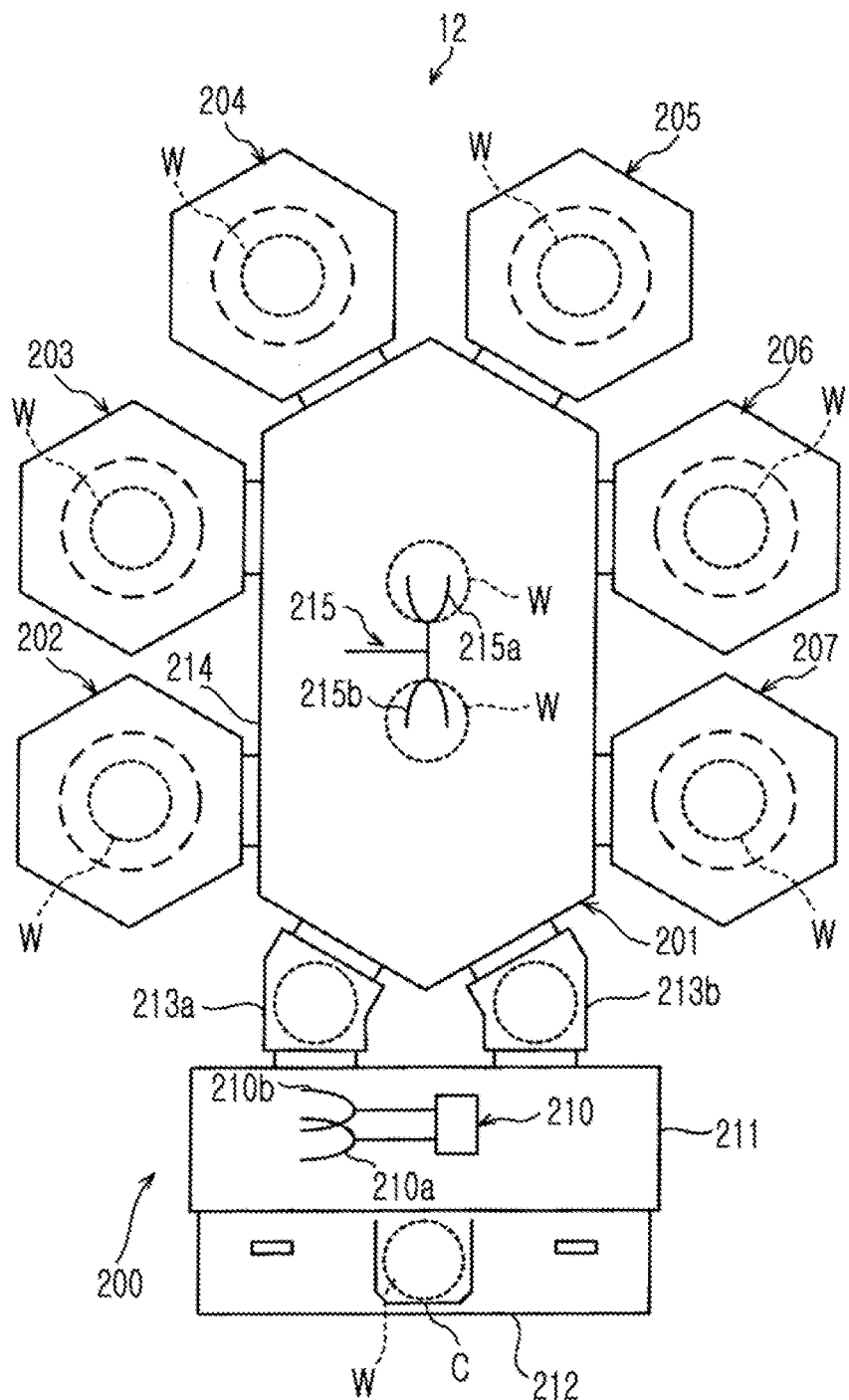
FIG. 5 is a schematic plan view of a configuration of a second processing unit.

The second processing unit 12, as shown in FIG. 5, includes a cassette station 200 carrying in/out the wafer W into/from the second processing unit 12, a common transfer unit 201 transferring the wafer W, a trimming device 202, a film forming device 203, an etching device 204, an ashing device 205, and an etching device 206, which perform predetermined processes on the wafer W, and a pattern size measuring device 207 for measuring sizes of a pattern of a sacrificial film or a pattern of a film to be processed on the wafer W. In addition, the predetermined processes performed by the trimming device 202, the film forming device 203, the etching device 204, the ashing device 205, the etching device 206, and the pattern size measuring device 207 will be described later.

The cassette station 200 includes a transfer chamber 211 in which a wafer transfer mechanism 210 for transferring the wafer W is provided. The wafer transfer mechanism 210 includes two transferring arms 210a and 210b that hold the wafer W in a nearly horizontal direction, and the wafer transfer mechanism 210 transfers the wafer W while holding the wafer W by using one of the transferring arms 210a and 210b. A cassette holding stage 212 on which a cassette C capable of accommodating a plurality of wafers W in parallel with each other is placed is provided at a side portion of the transfer chamber 211. In the example shown in FIG. 5, a plurality of cassettes C may be placed on the cassette holding stage 212.

The transfer chamber 211 and the common transfer unit 201 are connected to each other via two load lock devices 213a and 213b that are capable of performing vacuum suction.

The common transfer unit 201 includes a transfer chamber 214 having a sealable structure, which is formed as, for example, a polygonal shape (hexagonal shape in the present embodiment) when seen from above. A wafer transfer mechanism 215 for transferring the wafer W is provided in the transfer chamber 214. The wafer transfer mechanism 215 includes two transferring arms 215a and 215b that hold the wafer W in nearly horizontal direction, and transfers the wafer W while holding the wafer W by using one of the transferring arms 215a and 215b.

The trimming device 202, the film forming device 203, the etching device 204, the ashing device 205, the etching device 206, the pattern size measuring device 207, and load lock devices 213b and 313a above described are arranged on an outer portion of the transfer chamber 214 to surround the transfer chamber 214, and are arranged in the stated order in a clockwise direction when seen from above.

Next, a configuration of the pattern size measuring device 207 is described as follows. The pattern size measuring device 207 measures sizes of patterns formed on the wafer W or a wafer for inspection by using a scatterometry method. In addition, sizes of the pattern may refer to a line width of a line portion, a width of a space portion, a side wall angle of the line portion, and the like in the pattern. Also, the wafer for inspection denotes a wafer that is used to compensate for processing conditions of corresponding wafer W so that a space ratio of the pattern of a film to be processed on the wafer W for product may be 1:1. In addition, an inspection process of the wafer for inspection is performed before performing wafer processes of the wafer W. Therefore, the pattern size measuring device 207 mainly measures sizes of patterns on the wafer for inspection, and hereinafter, the configuration of the pattern size measuring device 207 will be described based on the wafer for inspection. In addition, the pattern size measuring device 207 can measure sizes of patterns on the wafer W, of course.

Figure 6:
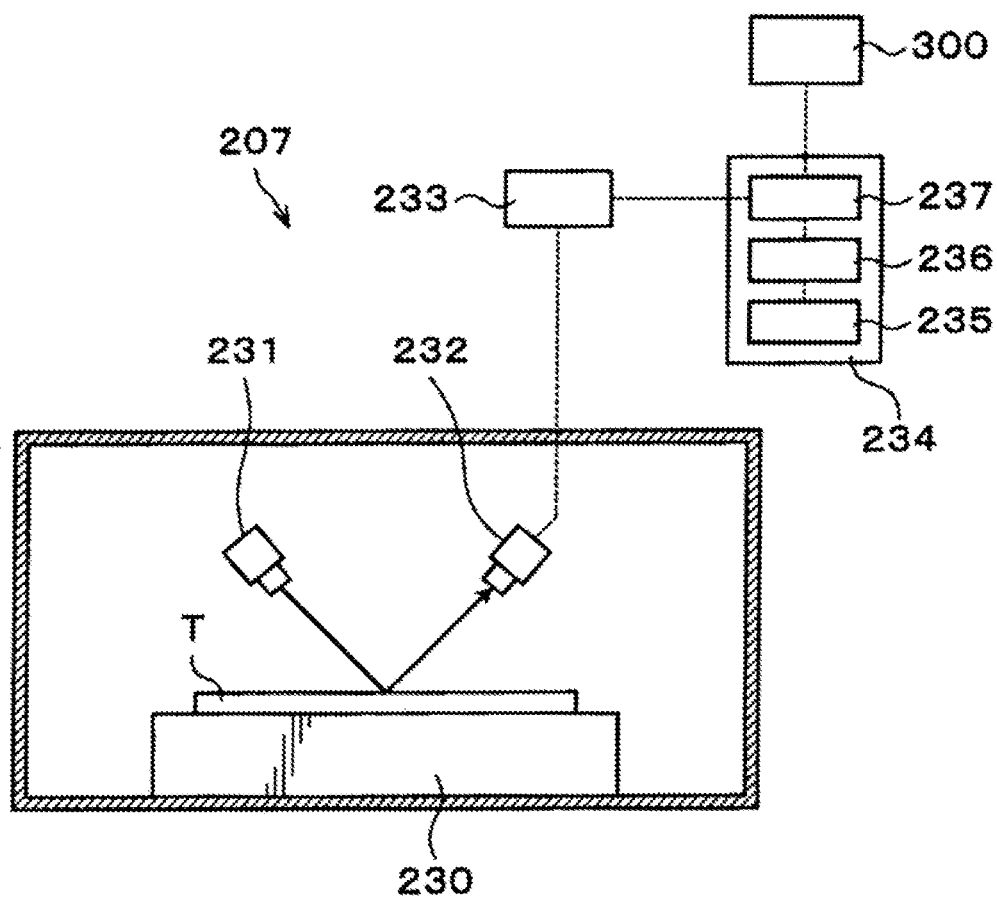
FIG. 6 is a longitudinal cross-sectional view schematically showing a configuration of a pattern size measuring apparatus.

As shown in FIG. 6, a holding stage 230 on which a wafer T for inspection is placed horizontally is provided in the pattern size measuring device 207. The holding stage 230 may be moved, for example, in a horizontal direction and in a two-dimensional way. A light irradiation unit 231 for irradiating light toward the wafer T for inspection placed on the holding stage 230 from an inclined direction and a photo detection unit 232 for detecting light reflected by the wafer T for inspection after being irradiated from the light irradiation unit 231 is provided above the holding stage 230.

The light irradiated from the light irradiation unit 231 is reflected by the patterns formed on the wafer T for inspection toward the photo detection unit 232. Information of the light detected by the photo detection unit 232 is output to a measuring unit 233. The information of the light may include, for example, a diffraction order of the light, a wavelength of the light, an incident angle of the light, and the like. The measuring unit 233 may measure a spectrum (light intensity distribution) of the reflected light reflected from the predetermined patterns formed on the wafer T for inspection, based on the acquired information of the light. In addition, the light irradiation unit 231 may be, for example, a Xenon lamp emitting white light, and the photo detection unit 232 may be, for example, a charge-coupled device (CCD) camera or the like. Meanwhile, in the present embodiment, the light is irradiated in an inclined direction from the light irradiation unit 231 and reflected by the patterns on the wafer T for inspection; however, the light may be irradiated from the light irradiation unit 231 perpendicularly to the patterns and reflected by the patterns on the wafer T for inspection.

The pattern size measuring device 207 may further include, for example, an information processing unit 234 that processes information for measuring sizes of the patterns. The information processing unit 234 may include, for example, a calculation unit 235, a memory 236, and an analyzing unit 237.

The calculation unit 235 calculates information to be stored in a library of the memory 236. In more detail, spectrums of reflected light beams that are reflected from a plurality of virtual patterns having different sizes, which are determined based on acknowledged information, for example, such as a shape, sizes of a target, and structure of the pattern are calculated. In addition, the calculation unit 235 calculates a target space ratio of a monitor pattern formed on a film to be processed on the wafer T for inspection, and calculates a range of space ratios of the virtual patterns included in the library.

Figure 7:
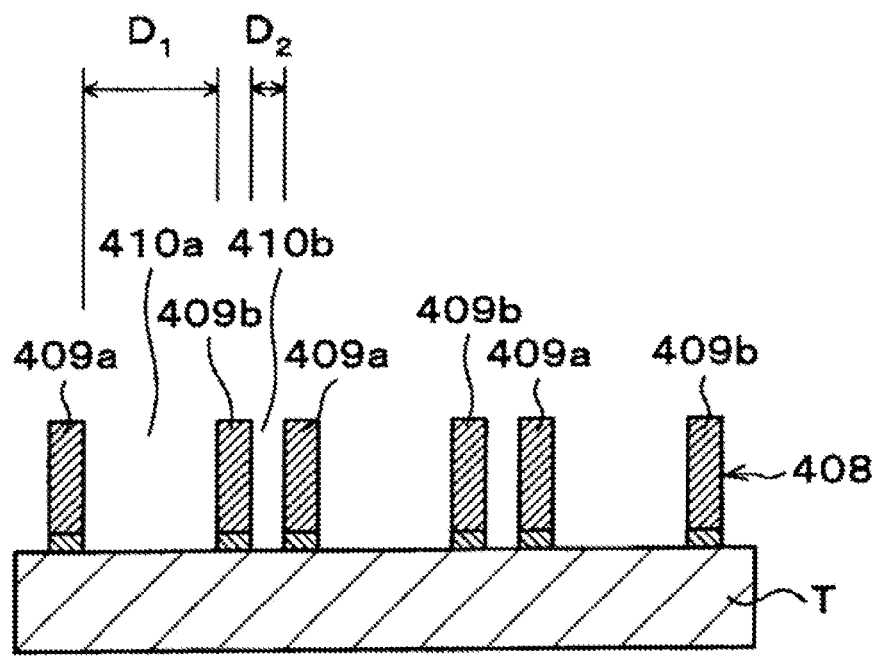
FIG. 7 is a diagram showing a monitor pattern formed on a film to be processed on a wafer for test.

In addition, as shown in FIG. 7, a monitor pattern 208 formed on the film to be processed on the wafer T for inspection is a pattern including a plurality of lines, and includes line portions 409a and 409b and space portions 410a and 410b. In addition, the above described space ratio is a ratio between a width $D_1$ of the first space portion 410a between the line portions 409a and 409b and a width $D_2$ of the second space portion 410b between the line portions 409b and 409a in the monitor pattern 408. In addition, in the present embodiment, a gate oxide film is formed under the film to be processed.

Next, a method of determining the target space ratio of the monitor pattern 408 by using the calculation unit 235 will be described. The space ratio of the monitor pattern 408 is determined to be different from 1:1 in order to prevent toggling that occurs conventionally. However, if the target space ratio is largely different from 1:1, there is no relevance between the processes performed on the wafer T for inspection and processes performed on the wafer W. That is, in this case, even if the processing conditions of the wafer W are compensated for based on the monitor pattern 408 formed on the wafer T for inspection, the corresponding processing conditions may not be appropriately compensated, and the pattern of the film to be processed on the wafer W may not be formed to have a space ratio of 1:1.

Thus, the present inventors researched about an appropriate target space ratio of the monitor pattern 408, and thus, it is recognized that the target space ratio may be determined based on reproducibility of a distance between a center of the line portion 409a and a center of the line portion 409b (hereinafter, referred to as 'distance reproducibility') and reproducibility of sizes of the line portions 409 (hereinafter, referred to as 'size reproducibility'). In more detail, it is recognized that the target space ratio of the monitor pattern 208 is appropriate when the distance reproducibility is 1.0 nm or less and the size reproducibility is 0.2 nm or less. That is, in this case, the processes performed on the wafer T for inspection and the processes performed on the wafer W are highly correlated with each other, and the processing conditions of the wafer W may be appropriately compensated for based on the monitor pattern 408 formed on the wafer T for inspection. In addition, reproducibility denotes a deviation degree (3v) of each parameter. In addition, sizes of the line portions 409 may be, for example, a line width of an upper end of the line portion 409, a line width of a lower end of the line portion 409, a height from the surface of the wafer W to the upper end of the line portion 409 (height between the line portion 409 and the gate oxide film), and the like.

Figure 8:
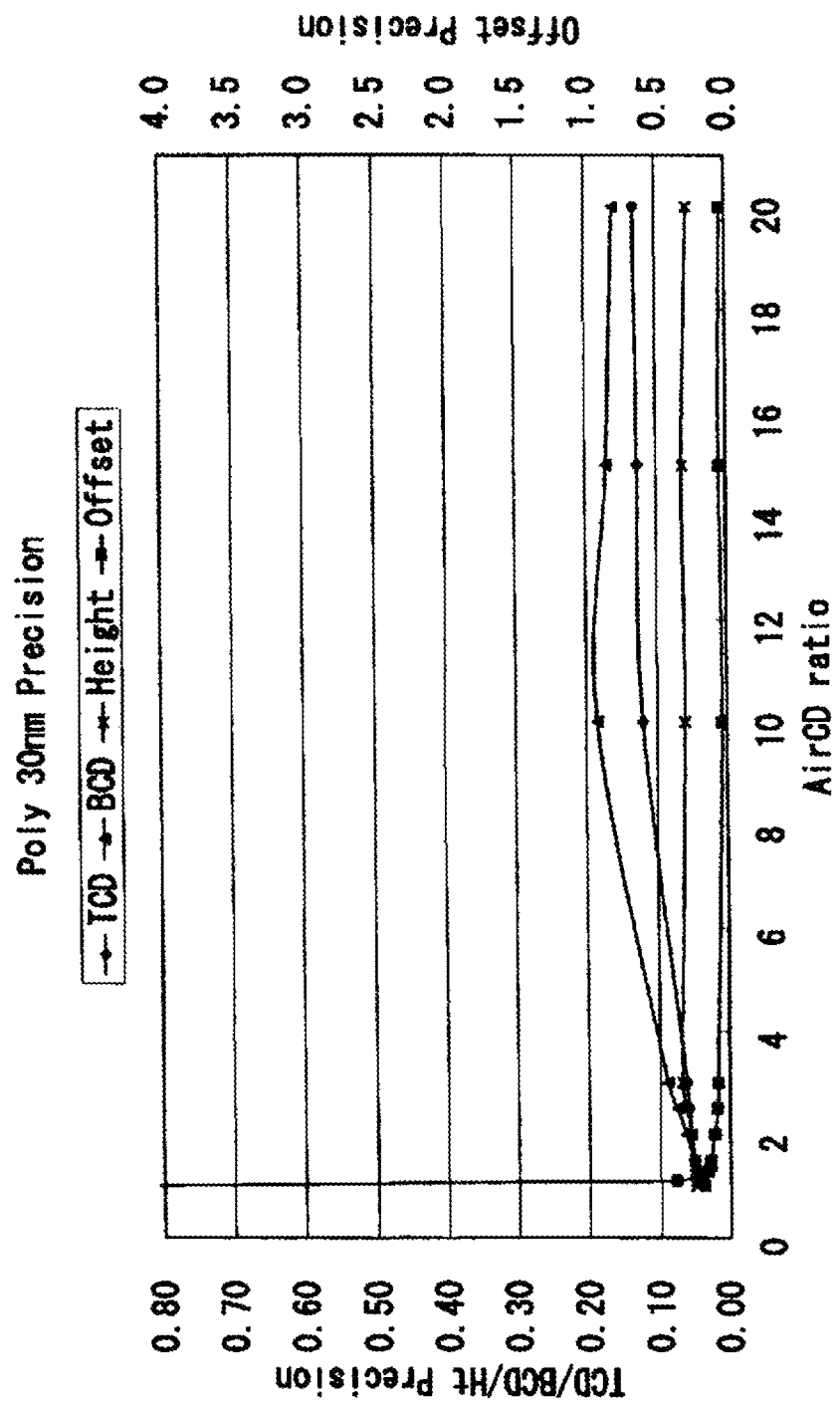
FIG. 8 is a graph showing a result of a simulation performed when a target space ratio of the monitor pattern is determined.
Figure 9:
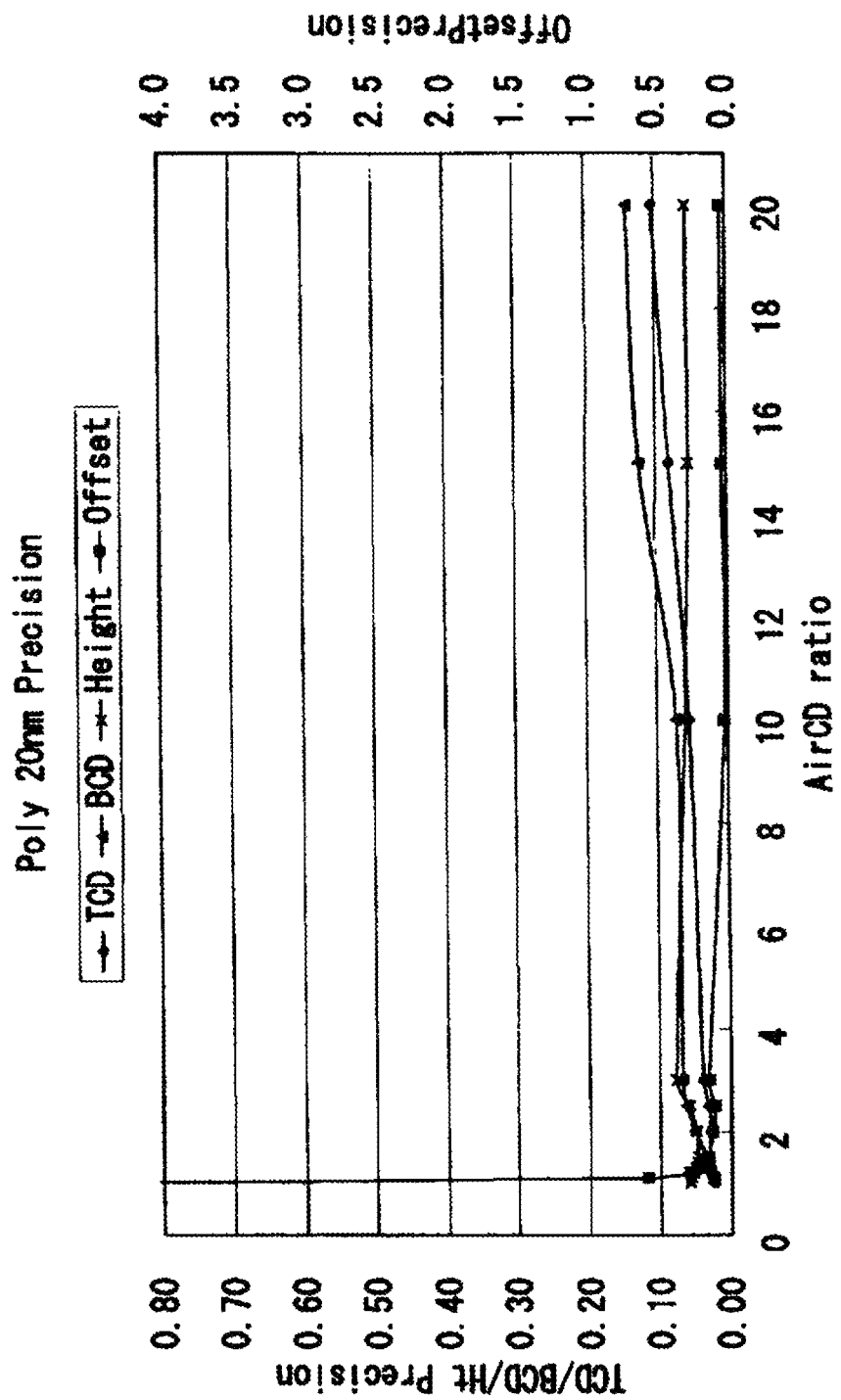
FIG. 9 is a graph showing a result of a simulation performed when a target space ratio of the monitor pattern is determined.
Figure 10:
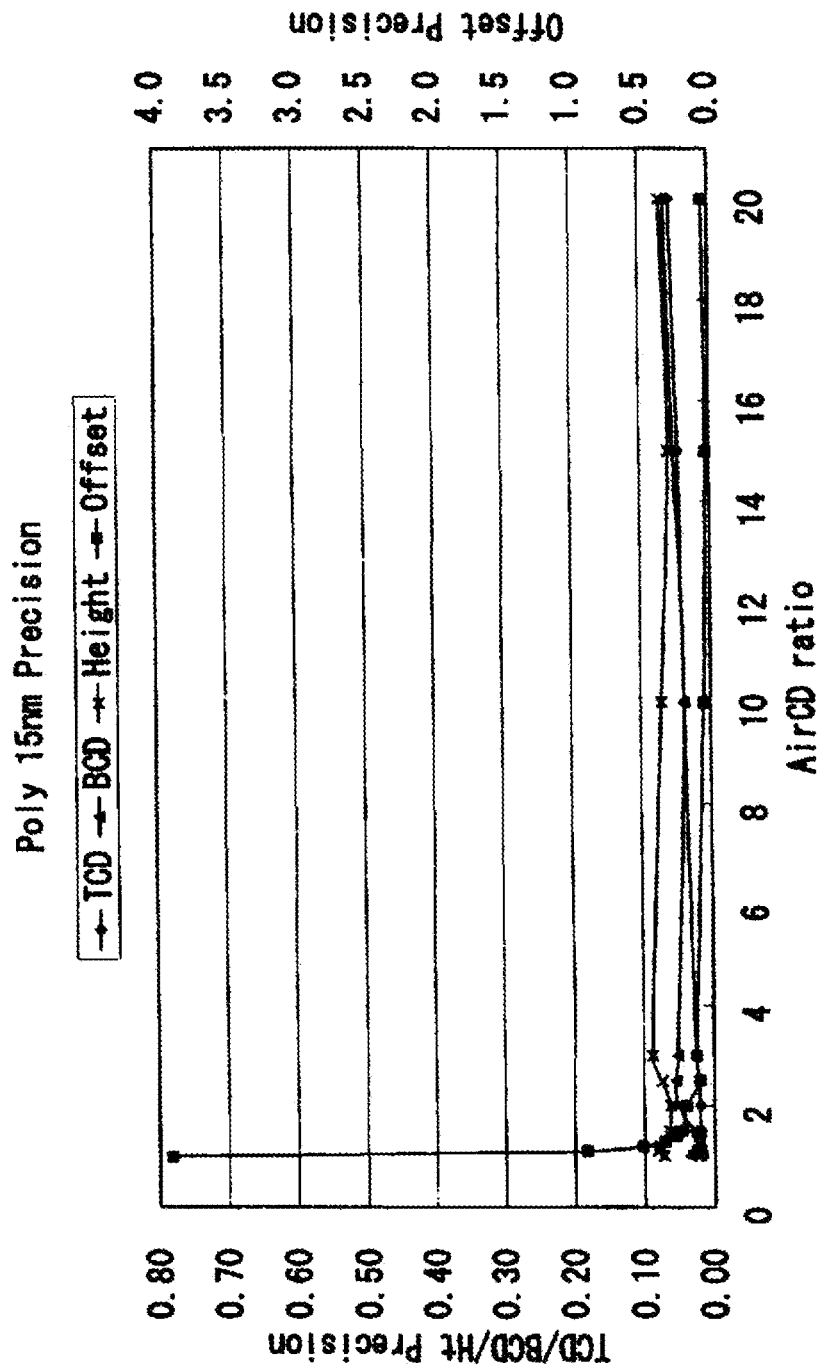
FIG. 10 is a graph showing a result of a simulation performed when a target space ratio of the monitor pattern is determined.

The target space ratio of the monitor pattern 408 is determined by performing a simulation so as to satisfy conditions of the distance reproducibility and the size reproducibility. FIGS. 8 through 10 show examples of simulation results.

FIG. 8 shows a result of a simulation when forming the monitor pattern 408 in which each of the line portions has a line width of 30 nm, on the wafer T for inspection. In this simulation, the space ratio of the monitor pattern 408 varies from 1:1 to 1:10. In addition, a height of the film to be processed (a polysilicon film) on the wafer W is 94 nm, and a height of the gate oxide film is 2 nm. In FIG. 8, Air CD ratio on a transverse axis denotes the space ratio of the monitor pattern 408 (here, Air CD means a space or a space width). In addition, in the example shown in FIG. 8, when the space ratio is 1:1, the Air CD ratio is 1, and when the space ratio is 1:10, the Air CD ratio is 10. In FIG. 8, Offset Precision of a first longitudinal axis denotes the distance reproducibility. Also, in FIG. 8, TCD/BCD/Ht Precision of a second longitudinal axis denotes the size reproducibility. That is, TCD (Top CD) denotes a line width of an upper end of the line portion 409, BCD (Bottom CD) denotes a line width of a lower end of the line portion 409, and Ht (Height) denotes a height from the surface of the wafer W to the upper end of the line portion 409.

Referring to FIG. 8, the Air CD ratio where the distance reproducibility is equal to 1.0 nm or less and the size reproducibility is equal to 0.2 nm or less is equal to 1.1 or greater, and more preferably, 10 or less. Therefore, the target space ratio of the monitor pattern 408 is determined within a range of 1:1.1 to 1:10.

FIGS. 9 and 10 show results of simulation that is the same as that of FIG. 8, except that line widths of the line portion 409 of the monitor pattern 408 are respectively 20 nm and 15 nm. Referring to FIGS. 9 and 10, the Air CD ratio where the distance reproducibility is 1.0 nm or less and the size reproducibility is 0.2 nm or less is 1.1 or greater in any case. Therefore, the target space ratio of the monitor pattern 408 is determined within a range of 1:1.1 or greater.

Figure 11:
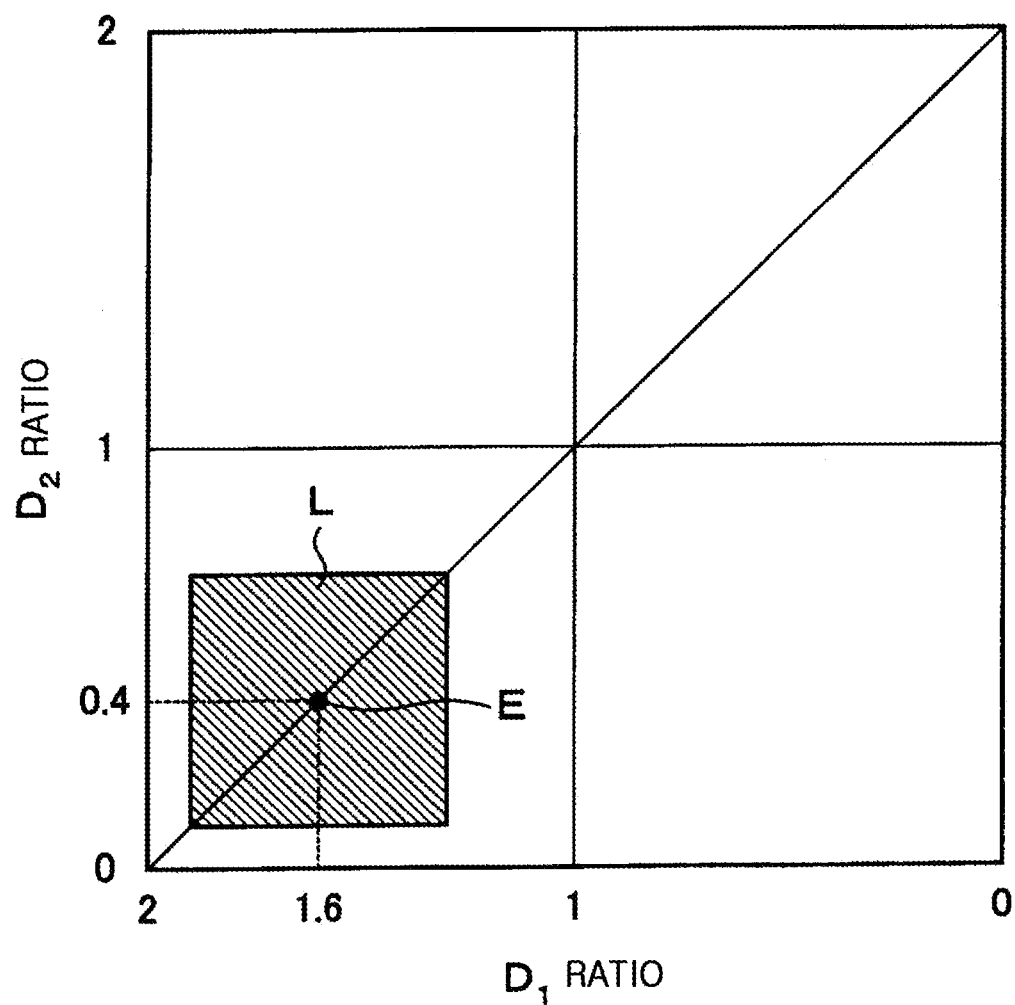
FIG. 11 is a graph showing a range of space ratios in a library.

Next, a method of determining a range of space ratios of virtual patterns used in the library of the memory 236 by using the calculation unit 235 will be described as follows. As shown in FIG. 11, a range of the space ratios (diagonal line portion in FIG. 11) of the virtual patterns in the library L includes the above described target space ratio of the monitor pattern 408, but does not include the space ratio of 1:1. That is, the library L includes a spectrum E of a virtual pattern having the target space ratio. Also, the library L does not include a space ratio that is located in a point symmetric position with the space ratio 1:1, but only include spectrums having different space ratio distribution. Therefore, the toggling that occurs conventionally can be prevented by using this library L.

The memory 236 stores each of calculated spectrums with respect to the virtual patterns calculated by the calculation unit 235 to generate the library L.

The spectrum about the actual monitor pattern 408 on the wafer T for inspection measured by the measuring unit 233 is output to the analyzing unit 237. The analyzing unit 237 combines the spectrum of the monitor pattern 408 output from the measuring unit 233 and the spectrum of the virtual pattern stored in the library L of the memory 236 to select a virtual pattern that is suitable for the spectrum. In addition, sizes of the virtual pattern are estimated as sizes of the monitor pattern 408, and the sizes of the monitor pattern 408 are measured. The measuring result of the sizes of the pattern is output to, for example, a controlling device 300 that will be described later.

Next, the controlling device 300 will be described. The controlling device 300 is configured by a universal computer including, for example, a CPU or a memory.

Figure 12:
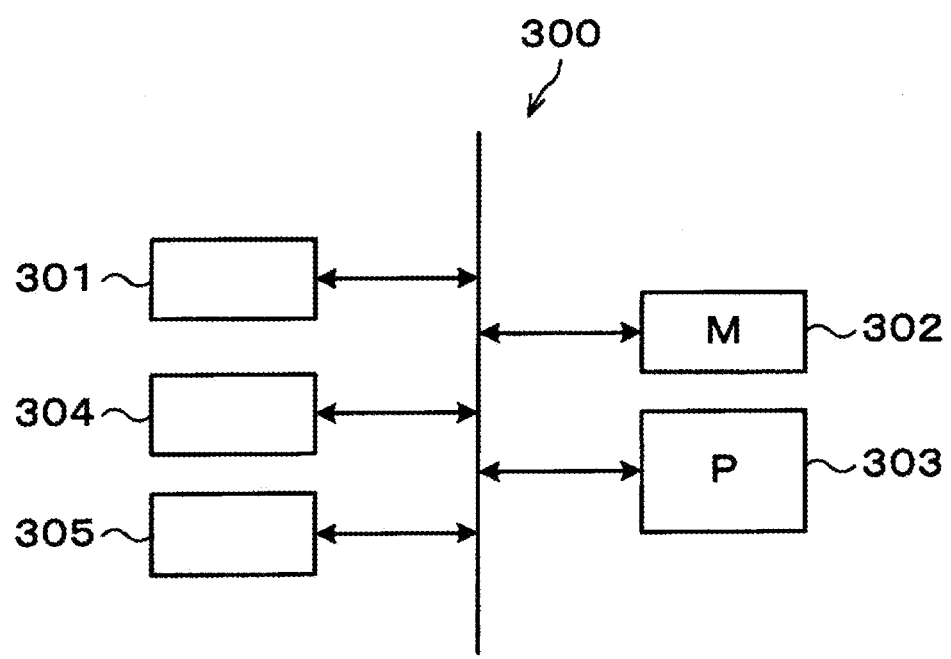
FIG. 12 is a block diagram of a controlling apparatus.

As shown in FIG. 12, the controlling device 300 includes an input unit 301 to which the size measuring result is input from the size measuring device 207, a data storage unit 302 in which various information M required to calculate the processing conditions of the first processing unit 11 or the second processing unit 12 is stored based on the size measuring result, a program storage unit 303 in which a program P for calculating the processing conditions of the first processing unit 11 or the second processing unit 12 is stored, a calculation unit 304 executing the program P for calculating the processing conditions, and an output unit 305 outputting the calculated processing conditions to the first processing unit 11 or the second processing unit 12.

The data storage unit 302 stores a regression equation for converting the sizes of the monitor pattern 408 having the target space ratio into a pattern of a film to be processed having a space ratio of 1:1, wherein the regression equation is calculated in advance. When calculating the regression equation, sizes of the pattern of the film to be processed having the space ratio of 1:1 are measured by using a CD-SEM. Meanwhile, the sizes of the monitor pattern 408 having the target space ratio are measured by using the scatterometry method. Then, after identifying that the sizes of the pattern of the film to be processed having the space ratio of 1:1 and the sizes of the monitor pattern 408 having the target space ratio are highly correlated with each other, the above regression equation is calculated.

In addition, the data storage unit 302 stores data representing correlation M between the processing conditions of the first processing unit 11 or the second processing unit 12 and the sizes of the pattern of the film to be processed.

Also, the program P for executing functions of the controlling device 300 is recorded in a computer-readable recording medium, for example, a computer readable hard disk (HD), a flexible disk (FD), a compact disk (CD), a magnet optical disk (MO), and a memory card, and may be installed in the controlling device 300 from the recording medium.

Figure 13:
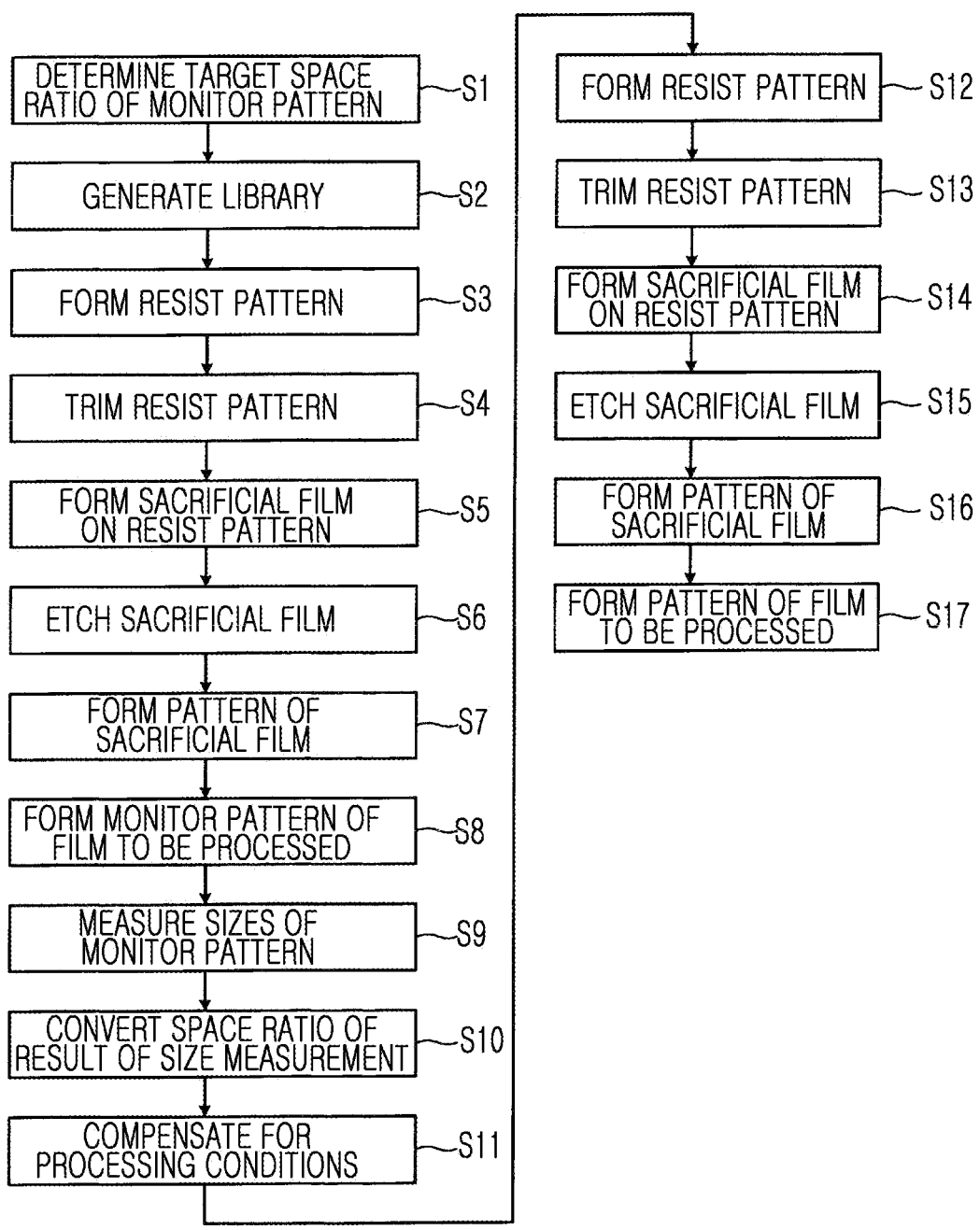
FIG. 13 is a flowchart describing inspection processes and wafer processes.

Next, processes of the wafer W for product in the system 1 for manufacturing the semiconductor device, which is configured as described above, will be described with an inspection process of the wafer T for inspection. FIG. 13 shows the inspection process of the wafer T for inspection, wafer processes of the wafer W, and main flow of processes. In addition, FIGS. 14 and 15 respectively show states of the wafer T for inspection and the wafer W in each of the processes. In addition, sizes of the films or patterns on the wafer T for inspection and the wafer W in FIGS. 14 and 15 do not necessarily correspond to actual sizes for the sake of comprehension.

Figure 14A:
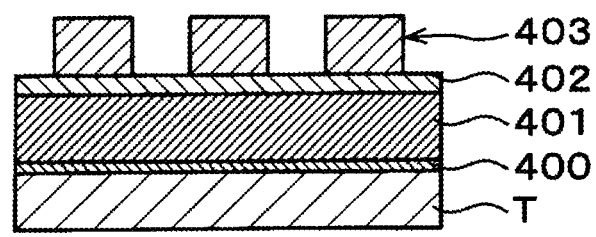

First, in order to compensate for processing conditions of the wafer W in the system 1 for manufacturing the semiconductor device, a series of processes are performed on the wafer T for inspection. In addition, a gate oxide film 400 and a film to be processed 401 are sequentially formed on the wafer T for inspection in advance, as shown in FIG. 14A.

Here, the target space ratio of the monitor pattern 408 formed on the film to be processed 401 of the wafer T for inspection is determined by the calculation unit 235 of the above described pattern size measuring device 207 in advance (operation S1 of FIG. 13). In the present embodiment, the target space ratio is determined as, for example, 1.6:0.4 as shown in FIG. 11. In addition, a range of the space ratios of the library L of the pattern size measuring device 207 is determined in advance as the range shown in FIG. 11. Based on the range of the space ratios in the library L, the calculation unit 235 calculates spectrum of the virtual patterns. In addition, the memory 236 stores the spectrum calculated by the calculation unit 235, so as to generate the library L (operation S2 of FIG. 13).

The wafer T for inspection is transferred to the applying and developing device 20 of the first processing unit 11. In the applying and developing device 20, a sheet of wafer T for inspection is extracted from the cassette C on the cassette holding stage 33 by the wafer transfer body 35, and then is transferred to the temperature adjusting device 70 of the third processing device group G3. The wafer T for inspection transferred to the temperature adjusting device 70 is adjusted to a predetermined temperature. After that, the wafer T for inspection is transferred to the bottom coating device 43 by the first transfer device 36, and as shown in FIG. 14A, an anti-reflection film 402 is formed on the film to be processed 401 on the wafer T for inspection. The wafer T for inspection on which the anti-reflection film 402 is formed is transferred to the heating device 102, the high temperature thermal processing device 75, and the high precision temperature adjusting device 80 by the first transfer device 36 in the stated order so that predetermined processes may be performed in each of the devices. After that, the wafer T for inspection is transferred to the resist applying device 40 so that a resist film is formed on the wafer T for inspection.

When the resist film is formed on the wafer T for inspection in the resist applying device 40, the wafer T for inspection is transferred to the PAB device 81 by the first transfer device 36, and continuously transferred to the peripheral exposure device 104 and the high precision temperature adjusting device 93 by the second transfer device 37 so that predetermined processes may be performed in each of the devices. After that, the wafer T for inspection is transferred to the exposure device 21 by the wafer transfer body 111 of the interface station 32 so that a predetermined pattern can be exposed on the resist film on the wafer T for inspection. The wafer T for inspection on which the exposure process has been finished is transferred to the PEB device 94 by the wafer transfer body 111, and then a heating process of the wafer T for inspection is performed.

When the thermal process in the PEB device 94 is finished, the wafer T for inspection is transferred to the high precision temperature adjusting device 91 by the second transfer device 37 so as to adjust the temperature of the wafer T. After that, the wafer T for inspection is transferred to the development processing device 50 so that a developing process is performed on the wafer T for inspection, and a pattern is formed on the resist film. Then, the wafer T for inspection is transferred to the POST device 85 by the second transfer device 37 so that a heating process is performed on the wafer T for inspection, and then, is transferred to the high precision temperature adjusting device 93 so that the temperature of the wafer T may be adjusted. After that, the wafer T for inspection is transferred to the transition device 71 by the first transfer device 36, and then is returned to the cassette C by the wafer transfer body 35. Then, a series of photography processes are finished. As such, as shown in FIG. 14A, a resist pattern 403 including a plurality of lines is formed on the wafer T for inspection (operation S3 of FIG. 13).

When the resist pattern 403 is formed on the wafer T for inspection in the first processing unit 11, the cassette C accommodating the corresponding wafer T for inspection is carried out of the applying and developing device 20, and then, carried in the second processing unit 12.

In the second processing unit 12, one wafer T for inspection is extracted from the cassette C on the cassette holding stage 212 by the wafer transfer mechanism 210, and then is carried in the load lock device 213a. When the wafer T for inspection is carried in the load lock device 213a, the load lock device 213a is sealed and depressurized. Then, inside of the load lock device 213a and inside of the transfer chamber 214 that is in a depressurized state with respect to the atmospheric pressure (for example, nearly vacuum state) communicate with each other. In addition, the wafer T for inspection is carried out of the load lock device 213a by the wafer transfer mechanism 215, and then, carried in the transfer chamber 214.

Figure 14B:
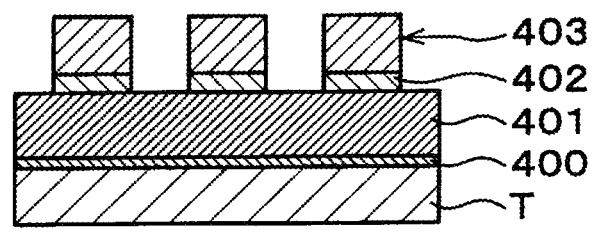

The wafer T for inspection that is carried in the transfer chamber 214 is carried in the trimming device 202 by the wafer transfer mechanism 215. As shown in FIG. 14B, in the trimming device 202, the resist pattern 403 formed on the wafer T for inspection is trimmed such that line widths of the pattern may be reduced. In addition, at the same time, the anti-reflection film 402 on the wafer T for inspection is etched by using the resist pattern 403 as a mask (operation S4 of FIG. 13). Also, the trimming of the resist pattern 403 and the etching of the anti-reflection film 402 may be performed through a plasma etching process using, for example, oxygen plasma.

Figure 14C:
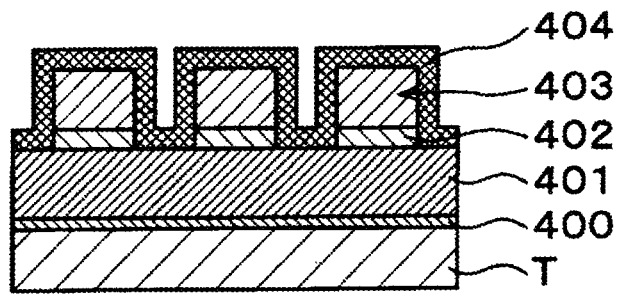

After that, the wafer T for inspection is returned to the transfer chamber 214 by the wafer transfer mechanism 215, and is carried in the film forming device 203. In the film forming device 203, a sacrificial film 404 is formed on the resist pattern 204 as shown in FIG. 14C by, for example, a chemical vapor deposition (CVD) method (operation S5 of FIG. 13). In addition, the sacrificial film 404 is a film functioning as a mask when the film to be processed 401 is etched, for example, may be a $SiO_2$ film.

Figure 14D:
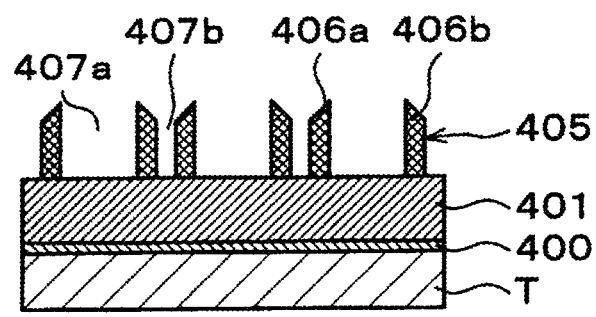

After that, the wafer T for inspection is returned to the transfer chamber 214 by the wafer transfer mechanism 215, and is carried in the etching device 204. In the etching device 204, as shown in FIG. 14D, the sacrificial film 404 is etched until the sacrificial film 404 remains only on side wall portions of the line portions in the resist pattern 403 (operation S6 of FIG. 13). In addition, this etching process is performed by using, for example, a mixture gas of a CF-based gas such as $CF_4$, $C_4F_8$, $CHF_3$, $CH_3F$, $CH_2F_2$ and an Ar gas, a gas formed by adding oxygen to the mixture gas, or the like.

Then, the wafer T for inspection is returned to the transfer chamber 214 by the wafer transfer mechanism 215, and is carried in the ashing device 205. In the ashing device 205, the resist pattern 403 and the anti-reflection film 402 are removed by an ashing or the like using, for example, oxygen plasma, as shown in FIG. 14D. In addition, a sacrificial film pattern 405 is formed on the film to be processed 401 (operation S7 of FIG. 13). Here, the sacrificial film pattern 405 includes a plurality of lines including line portions 406a and 406b and space portions 407a and 407b. A first space portion 407a is a space formed between the line portions 406a and 406b, and is formed by removing the resist pattern 403. A second space portion 407b is a space formed between the line portions 406b and 406a, and is formed between two adjacent resist patterns 403 and 403.

Figure 14E:
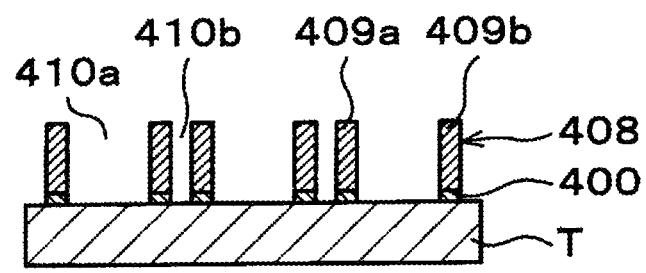

After that, the wafer T for inspection is returned to the transfer chamber 214 by the wafer transfer mechanism 215, and is carried in the etching device 206. In the etching device 206, the film to be processed 401 is etched by using the sacrificial film pattern 405 as a mask. In addition, the sacrificial film pattern 405 is removed, and as shown in FIG. 14E, the monitor pattern 408 of the film to be processed 401 is formed on the wafer T for inspection (operation S8 of FIG. 13). Here, the gate oxide film 400 under the film to be processed 401 is also etched. In addition, the etching process is performed by using, for example, an HBr gas. In addition, the monitor pattern 408 is a second monitor pattern in the present embodiment.

Then, the wafer T for inspection is returned to the transfer chamber 214 by the wafer transfer mechanism 215, and is carried in the pattern size measuring device 207. In the pattern size measuring device 207, the wafer T for inspection is placed on the holding stage 230 first. Next, the light irradiation unit 231 irradiates light onto the monitor pattern 408 of the film to be processed on the wafer T for inspection, and reflected light is detected by the photo detecting unit 232. In addition, the measuring unit 323 measures a spectrum of the monitor pattern 408. The spectrum is output to the information processing unit 234. In the information processing unit 234, spectrums with respect to a plurality of virtual patterns are calculated in advance by the calculation unit 235 as described above, and the memory 236 stores the spectrums of the virtual patterns and generates the library L. In addition, the analyzing unit 237 compares the spectrum of the actual monitor pattern 408 measured by the measuring unit 323 with the spectrums of the virtual patterns included in the library L. In addition, the pattern shape having a suitable spectrum in the library L is estimated as the monitor pattern 408. As such, sizes of the monitor pattern 408 are measured (operation S9 of FIG. 13). Results of measuring the sizes of the monitor pattern 408 are output to the controlling device 300.

In the controlling device 300, the calculation unit 304 converts the measuring results of the sizes of the monitor pattern 408 into sizes of a pattern of the film to be processed, a space ratio of which is aimed to be 1:1, by using a regression equation stored in the data storage unit 302 (operation S10 of FIG. 13).

Also, the calculation unit 304 compensates for the processing conditions of the first processing unit 11 or the second processing unit 12 by using the correlation M stored in the data storage unit 302 and the program P stored in the program storage unit 303, based on the converted sizes of the pattern of the film to be processed (operation S11 of FIG. 13). In the present embodiment, processing conditions in the trimming device 202 are compensated based on a difference between a width $D_1$ of the first space portion and a width $D_2$ of the second space portion in the converted pattern of the film to be processed. In more detail, if the width $D_1$ of the first space portion is greater than the width $D_2$, for example, the processing time in the trimming device 202 is increased. On the other hand, if the width $D_1$ of the first space portion is less than the width $D_2$, the processing time in the trimming device 202 is reduced.

The compensated processing conditions are output from the output unit 305 to the trimming device 202. In addition, the processing conditions of the trimming device 202 are fed-back controlled. As such, a series of inspection processes (operations S1 through S11 of FIG. 13) performed on the wafer T for inspection are finished.

Figure 15A:
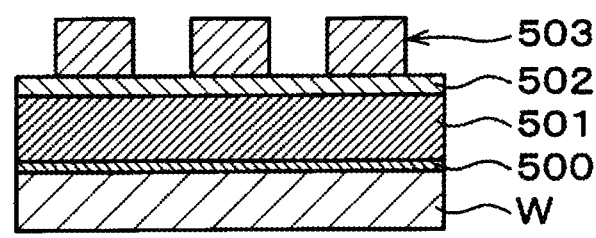

Next, a series of wafer processes are performed on the wafer W for product. In addition, a gate oxide film 500 and a film to be processed 501 are sequentially formed on the wafer W from a lower portion, as shown in FIG. 15A.

The wafer W is carried in the first processing unit 11 so that a photolithography process is performed. In addition, as shown in FIG. 15A, an anti-reflection film 502 and a resist pattern 503 are formed on the film to be processed 501 on the wafer W (operation S12 of FIG. 13). The photolithography process is the same as the process performed on the wafer T for inspection in the above described operation S3, and detailed descriptions thereof are omitted.

Figure 15B:
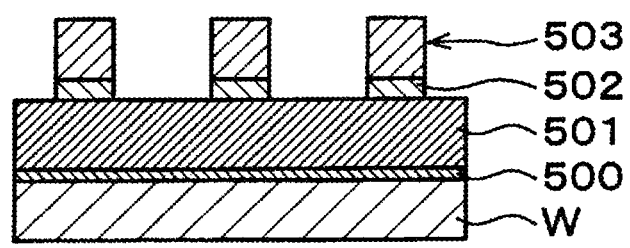
Figure 15C:
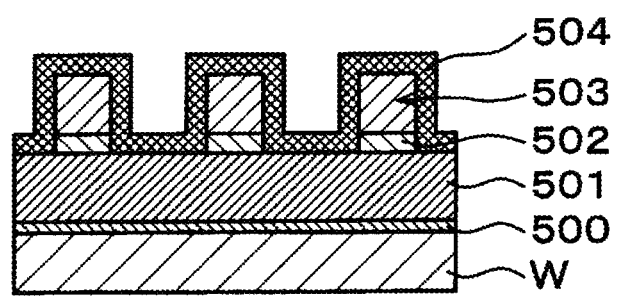

After that, the wafer W is transferred to the second processing unit 12. First, in the trimming device 202, the resist pattern 503 on the wafer W is trimmed as shown in FIG. 15B, and the anti-reflection film 502 is etched. The processing conditions at this time are the processing conditions that are compensated for in the above described operation S11 (operation S13 of FIG. 13). After that, in the film forming device 203, a sacrificial film 504 is formed on the resist pattern 503 as shown in FIG. 15C (operation S14 of FIG. 13).

Figure 15D:
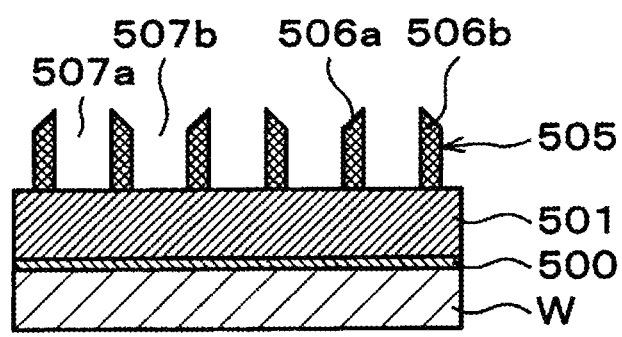

Then, as shown in FIG. 15D, the sacrificial film 504 is etched in the etching device 504 (operation S15 of FIG. 13), and the resist pattern 503 and the anti-reflection film 502 are removed in the ashing device 205 to form a pattern 505 of the sacrificial film is formed on the film to be processed 501 (operation S16 of FIG. 13). In addition, the pattern 505 of the sacrificial film includes a plurality of lines including line portions 506a and 506b and space portions 507a and 507b. A first space portion 507a is a space formed between the line portions 506a and 506b, and is formed by removing the resist pattern 503. A second space portion 507b is a space formed between the line portions 506b and 506a, and is formed between two adjacent resist patterns 503 and 503.

Figure 15E:
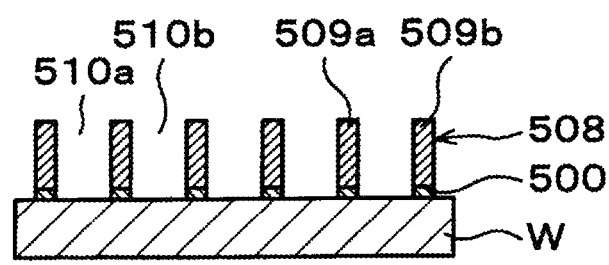

After that, the film to be processed 501 is etched by using the pattern 505 of the sacrificial film as a mask in the etching device 206, and thus, a pattern 508 of the film to be processed is formed on the wafer W as shown in FIG. 15E (operation S17 of FIG. 13). The pattern 508 of the film to be processed has a space ratio of 1:1, and is formed to have predetermined sizes. In addition, the pattern 508 of the film to be processed includes a plurality of lines including line portions 509a and 509b and space portions 510a and 510b.

In addition, since processes of operations S13 through S17 with respect to the wafer W are the same as the processes in operations S4 through S8 with respect to the wafer T for inspection, detailed descriptions are omitted. As such, a series of wafer processes (operations S12 through S17 of FIG. 13) performed on the wafer W are finished.

According to the present embodiment, a predetermined process is performed on the wafer T for inspection to form the monitor pattern 408 on the film to be processed 401, and then, the sizes of the monitor pattern 408 are measured by using the scatterometry method. Here, the target space ratio of the monitor pattern 408 is different from a ratio of 1:1. In addition, a range of space ratios in the library L that is used in the scatterometry method when measuring the sizes of the monitor pattern 408 includes the target space ratio, but does not include the space ratio of 1:1. That is, the library L does not include a space ratio that is located at a point symmetric location with the space ratio 1:1, but include the other spectrums. Therefore, according to the present embodiment, the sizes of the monitor pattern 408 can be measured exactly without generating a toggling like in the conventional art. After that, the measured sizes of the monitor pattern 408 are converted into sizes of the pattern of the film to be processed, the space ratio of which is aimed to be 1:1, by using the regression equation that is stored in advance so as to compensate for the processing conditions of predetermined processes. Therefore, the predetermined processes are performed on the wafer W with the compensated processing conditions, and thus the pattern 508 of the film to be processed on the wafer W may be formed to have the space ratio of 1:1 and to have predetermined sizes appropriately.

In addition, the target space ratio of the monitor pattern 408 is determined to be a ratio where the distance reproducibility is 1.0 nm or less and the size reproducibility is 0.2 nm or less. Therefore, the target space ratio of the monitor pattern 408 becomes appropriate in view of precision of measurement. In addition, since the processes are performed after identifying that the processes performed on the wafer T for inspection and the processes performed on the wafer W are highly correlated, the processing conditions of the wafer W may be appropriately compensated for based on the monitor pattern 408 formed on the wafer T for inspection.

In the above embodiment, in the operation S11, the processing conditions in the trimming device 202 are compensated for based on the sizes of the monitor pattern 408 on the wafer T for inspection; however, processing conditions of the first processing unit 11 may be compensated for. In this case, the sizes of the monitor pattern 408 are converted into sizes of the pattern of the film to be processed, the space ratio of which is aimed to be 1:1, and processing conditions of, for example, the exposure device 21 are compensated based on the difference between the width $D_1$ of the first space portion and the width $D_2$ of the second space portion in the converted pattern of the film to be processed. For example, if the width $D_1$ of the first space portion is greater than the width $D_2$, the exposure amount is increased, and when the width $D_1$ of the first space portion is less than the width $D_2$, the exposure amount is reduced. In the present embodiment, the processing conditions of the wafer W are appropriately compensated, and the pattern 508 of the film to be processed on the corresponding wafer W may be formed to have the space ratio of 1:1 and predetermined sizes. In addition, since the exposure amount may be changed at every shot, the pattern 508 of the film to be processed can be formed to have predetermined sizes even when the line width of the upper end or the lower end of the monitor pattern 408 on the wafer T for inspection may vary.

Also, in this case, instead of the processing conditions in the exposure device 21, processing conditions of the thermal process performed in the applying and developing device 20 can be compensated for, and in particular, a heating temperature of the wafer W in the PEB devices 94 through 99 can be compensated for. In this case, since the processing conditions of the wafer W are appropriately compensated for, the pattern 508 of the film to be processed on the corresponding wafer W can be appropriately formed to have the space ratio of 1:1 and the predetermined sizes. In addition, since the heating temperature can be compensated for at every region in the wafer surface, the pattern 508 of the film to be processed can be formed to have predetermined sizes even when the line width of the upper end or the lower end of the monitor pattern 408 on the wafer T for inspection may vary. In addition, the processing conditions of different thermal processes performed in the applying and developing device 20, for example, the heating temperatures of the wafer W in the PAB devices 81 through 84 and in the POST devices 85 through 89 can be compensated for.

Also, in the above described operation S11, processing conditions in the film forming device 203 may be compensated for based on the sizes of the monitor pattern 408 on the wafer T for inspection. In this case, for example, the sizes of the monitor pattern 408 are converted into the sizes of the pattern of the film to be processed, the space ratio of which is aimed to be 1:1, and processing time in the film forming device 203 is compensated for based on the line width of the line portion in the converted pattern of the film to be processed. For example, if the line width of the line portion in the pattern of the film to be processed is large, the processing time is reduced, and if the line width of the line portion is small, the processing time is increased. As such, the processing conditions of the wafer W can be appropriately compensated for, and thus, the pattern 508 of the film to be processed on the wafer W can be appropriately formed to have the space ratio of 1:1 and the predetermined sizes.

Also, in this case, instead of the processing conditions of the film forming device 203, processing conditions in the etching device 206, for example, the processing time, can be compensated for. For example, if the line width of the line portion in the pattern of the film to be processed is large, the processing time is increased, and if the line width of the line portion is small, the processing time is reduced. As such, the processing conditions of the wafer W can be appropriately compensated for, and thus, the pattern 508 of the film to be processed on the wafer W can be appropriately formed to have the space ratio of 1:1 and the predetermined sizes.

In the above embodiment, the pattern formed on the film to be processed 401 of the wafer T for inspection is the monitor pattern 408; however, the pattern 405 of the sacrificial film on the wafer T for inspection may be used as the monitor pattern (hereinafter, referred to as 'monitor pattern 405'). In addition, the monitor pattern 405 is a first monitor pattern in the present invention.

Also, the target space ratio of the monitor pattern 405 is determined by the calculation unit 235 of the pattern size measuring device 207. The target space ratio is determined based on the distance reproducibility (1.0 nm or less) and the size reproducibility (0.2 nm or less), and is determined in the same method as the operation (operation S1) of determining the target space ratio of the monitor pattern 408 formed on the film to be processed 401. Thus, detailed descriptions of the determination method are not provided.

In the present embodiment, the processing conditions of the trimming device 202 are compensated for based on the sizes of the monitor pattern 405 on the wafer T for inspection, in the operation S11 described above. The compensation of the processing conditions in the trimming device 202 are the same as the compensation based on the monitor pattern 408 in the above described operation S11, and thus detailed descriptions are omitted there.

Also, in this case, instead of the processing conditions in the trimming device 202, the processing conditions of the first processing unit 11 can be compensated for. The processing conditions that are to be compensated for may be, for example, the processing condition (exposure amount) of the exposure device 21, the processing condition (heating temperature) in the PEB devices 94 through 99, the PAB devices 81 through 84, and the POST devices 85 through 89, or the like, like the compensation based on the monitor pattern 408.

Also, in this case, instead of the processing conditions in the trimming device 202 or the processing conditions in the first processing unit 11, the processing conditions in the film forming device 203 can be compensated for. The processing conditions that are to be compensated for may be, for example, the processing time of the film forming device 203, like the compensation based on the monitor pattern 408.

In addition, the processing condition compensated based on the monitor pattern 405 may be the processing condition in the etching device 206, for example, the processing time. Accordingly, the processing condition in the etching device 206 is feed-forward controlled. In this case, for example, the sizes of the monitor pattern 405 are converted into sizes of the sacrificial film pattern, the space ratio of which is aimed to be 1:1, and the processing time in the etching device 206 can be compensated for based on a difference between a width $D_1$ of a first space portion and a width $D_2$ of a second space portion in a converted pattern of the sacrificial film pattern.

As described above, various processing conditions in the wafer processes can be compensated for based on the monitor pattern 405 of the sacrificial film on the wafer T for inspection. In any case, the processing conditions of the wafer W can be appropriately compensated for, the pattern 508 of the film to be processed on the wafer W can be appropriately formed to have the space ratio of 1:1 and the predetermined sizes.

Figure 16A:
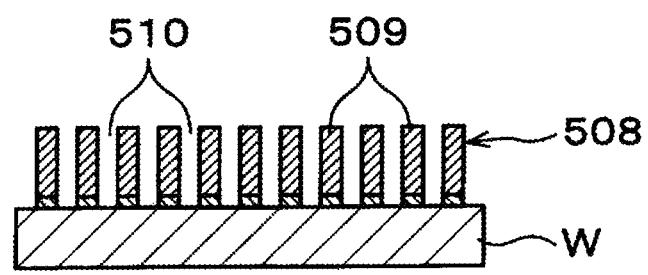
Figure 16B:
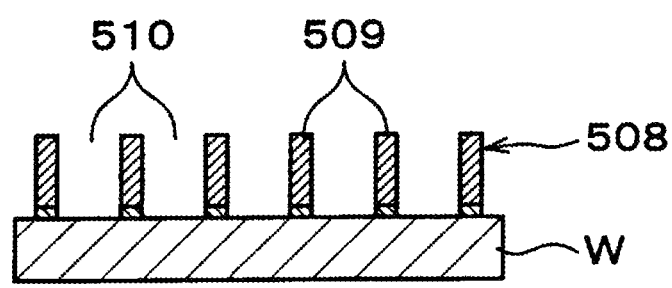
Figure 17:
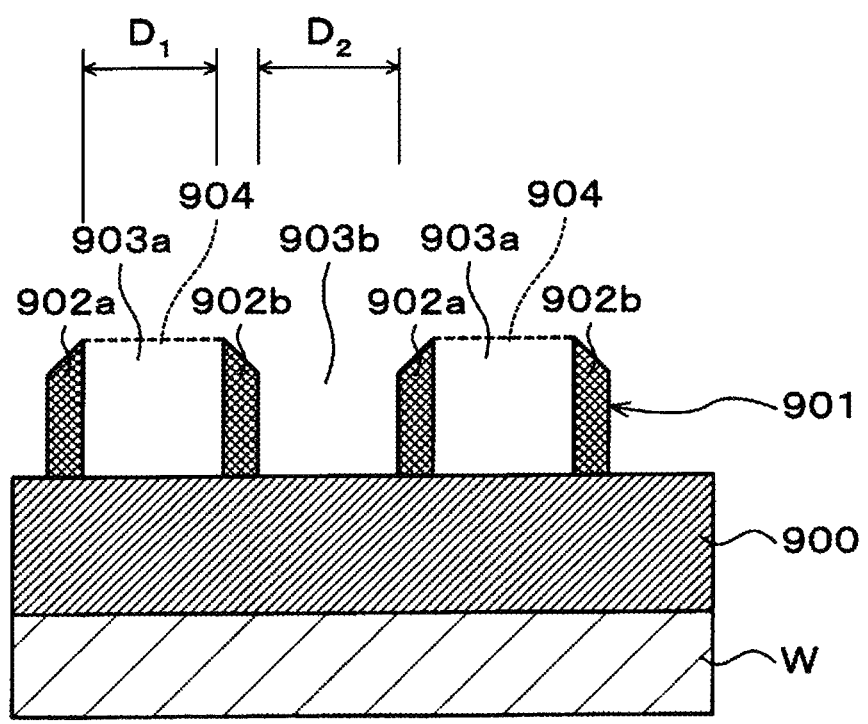
FIG. 17 is a diagram showing a pattern of a sacrificial film, in which a space ratio is 1:1.
Figure 18:
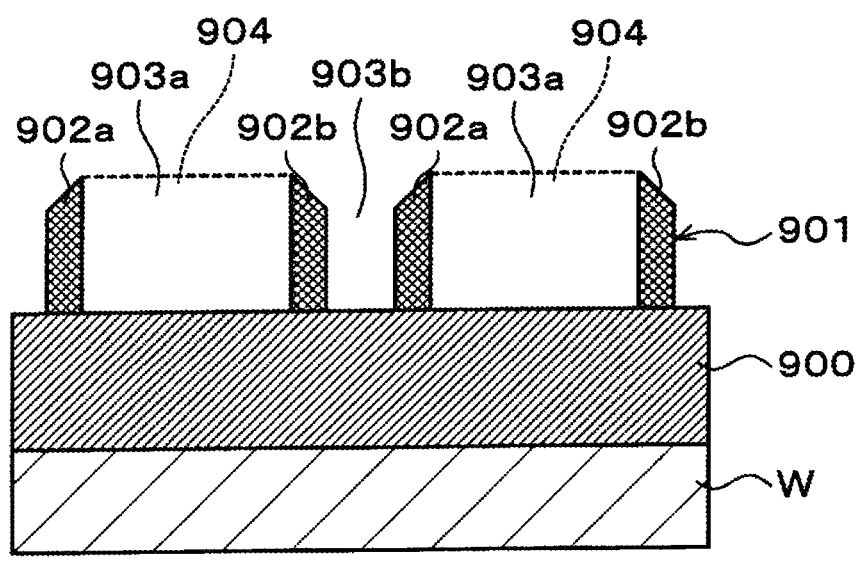
FIG. 18 is a diagram showing a pattern of a sacrificial film formed on a wafer by using a conventional semiconductor device manufacturing method.
Figure 19:
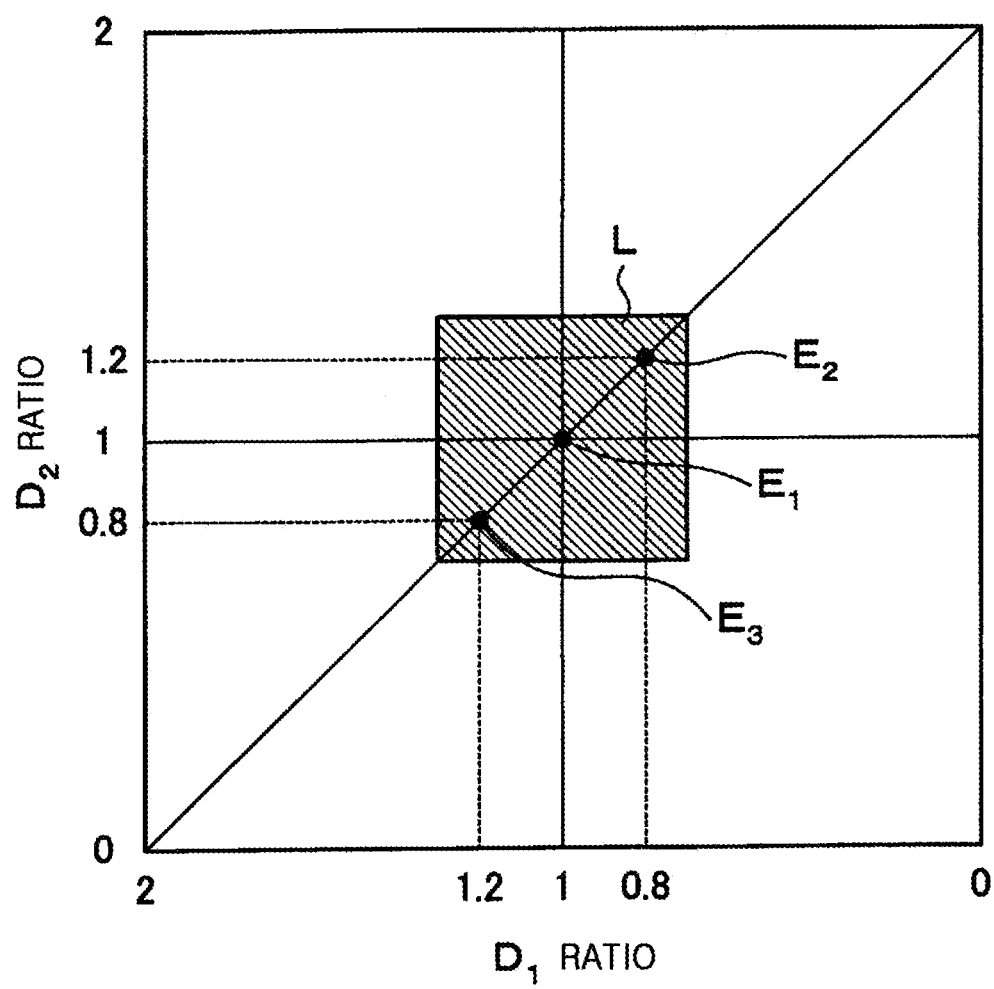
FIG. 19 is a graph showing a range of space ratios in a library according to the conventional art.
Figure 20:
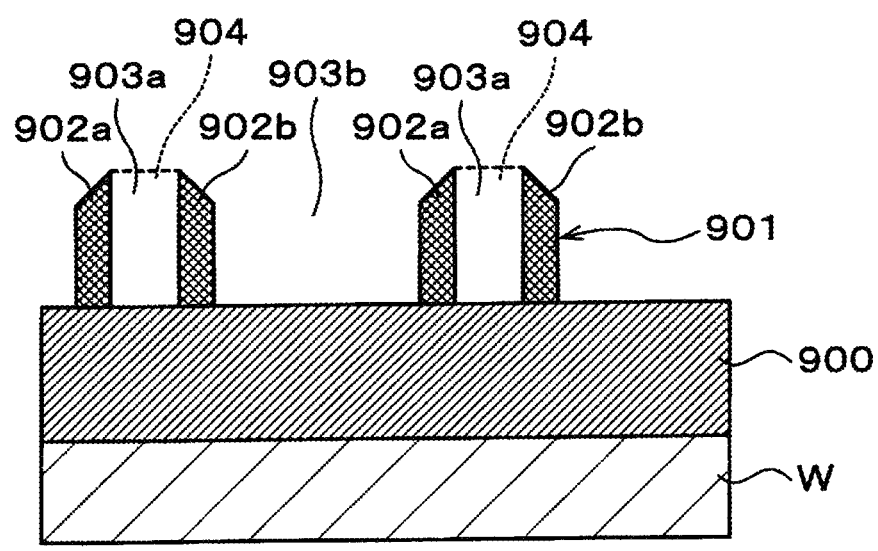
FIG. 20 is a diagram showing a pattern of a sacrificial film formed on a wafer, which is measured by a conventional pattern size measurement method.

The method of manufacturing the semiconductor device (operations S1 through S17) according to the above embodiment can be applied to a case where a ratio between the line width of the line portion 509 and the width of the space portion 510 in the pattern 508 of the film to be processed is arbitrary, as shown in FIGS. 16A and 16B. FIG. 16A shows a case where the ratio between the line width of the line portion 509 and the width of the space portion 510 is, for example, 1:1, and FIG. 16B shows a case where the ratio between the line width of the line portion 509 and the width of the space portion 510 is, for example, 1:3. As described above, when the pattern 508 of the film to be processed, which has the space ratio of 1:1, is formed on the wafer W regardless of the ratio between the line width of the line portion 509 and the width of the space portion 510, toggling occurs conventionally. According to the manufacturing method of the present invention, even in the above case, the pattern 508 of the film to be processed on the wafer W can be formed appropriately to have the space ratio of 1:1 and the predetermined sizes. In addition, the ratio between the line width of the line portion 509 and the width of the space portion 510 of the corresponding pattern 508 of the film to be processed is not regarded.

In the above described embodiments, the trimming device 202, the film forming device 203, the etching device 204, the ashing device 205, and the etching device 206 are provided in the second processing unit 12; however, the above elements may be independently provided from each other.

While this invention has been particularly shown and described with reference to exemplary embodiments thereof, it will be understood by those skilled in the art that various changes in form and details may be made therein without departing from the spirit and scope of the invention as defined by the appended claims. The present invention is not limited to the above embodiments, but may adopt various embodiments. The present invention may be applied to a case where a predetermined pattern is formed on the wafer by using a different kind of a film, for example, a predetermined pattern is formed on an oxide film as a film to be processed by using a SiN film as a hard mask. Also, the present invention can be applied to other processes except for the SWT method, for example, a double-patterning process and a double-exposure process such as a LELE method and LLE method. In addition, the present invention can be applied to a case where the substrate is a flat panel display (FPD), a mask reticle for photomask, and the like, besides the wafer.

INDUSTRIAL APPLICABILITY

The present invention is advantageous in view of, for example, manufacturing a semiconductor device by forming a predetermined pattern on a film to be processed on a substrate such as a semiconductor wafer.

LIST OF REFERENCE NUMERALS

1: system for manufacturing semiconductor device
11: first processing unit
12: second processing unit
20: applying and developing device
21: exposure device
81~84: PAB device
85~89: POST device
94~99: PEB device
202: trimming device
203: film forming device 204: etching device
205: ashing device
206: etching device
207: pattern size measuring device
300: controlling device
401: film to be processed
402: anti-reflection film
403: resist pattern
404: sacrificial film
405: pattern of sacrificial film (monitor pattern)
406a, 406b: line portion
407a, 407b: space portion
408: pattern of a film to be processed (monitor pattern)
409a, 409b: line portion
410a, 410b: space portion
501: film to be processed
502: anti-reflection film
503: resist pattern
504: sacrificial film
505: pattern of sacrificial film
506a, 506b: line portion
507a, 507b: space portion
508: pattern of a film to be processed
509a, 509b: line portion
510a, 510b: space portion
L: library
T: wafer for inspection
W: wafer

The invention claimed is:

1. A method of manufacturing a semiconductor device by performing predetermined processes on a substrate to form a pattern including line portions and space portions and having a space ratio of 1:1 between a width of a first space portion and a width of a second space portion that is adjacent to the first space portion on a film to be processed on the substrate,
wherein the predetermined processes include:
forming a resist pattern formed as a plurality of lines on the film to be processed on the substrate, by performing a photolithography process on the substrate;
trimming the resist pattern;
forming a sacrificial film that is a mask used when etching the film to be processed on the resist pattern;
forming process of forming a pattern of the sacrificial film on the film to be processed on the substrate, wherein the pattern comprises a plurality of lines, by etching the sacrificial film so as to have the sacrificial film remain only on side wall portions of line portions of the resist pattern, and by removing the resist pattern;
forming a pattern of the film to be processed including a plurality of lines on the film to be processed, by etching the film to be processed by using the sacrificial film pattern as a mask;
forming a first monitor pattern which is formed on a sacrificial film of a substrate for inspection in the forming of the sacrificial film pattern and forming a second monitor pattern which is formed on a film to be processed on the substrate for inspection in the forming of the film to be processed pattern by performing predetermined processes on the substrate for inspection, wherein target space ratios of the first and second monitor patterns are different from a ratio of 1:1;
measuring sizes of the first monitor pattern or the second monitor pattern, in a scatterometry method by using a library including sacrificial film patterns or patterns of the film to be processed, wherein a range of space ratios of the library includes the target space ratio and does not include the space ratio of 1:1;
converting the sizes of the first or second monitor pattern, which are measured through the measuring of sizes of the first or second monitor pattern, into sizes of a sacrificial film pattern or a pattern of a film to be processed, a space ratio of which is aimed to be 1:1, by using a regression equation for converting the sizes of the first monitor pattern or the second monitor pattern having the target space ratio into sizes of a sacrificial film pattern or a pattern of a film to be processed having a space ratio of 1:1;
compensating for processing conditions in the predetermined processes, based on the sizes of the sacrificial film pattern or the pattern of the film to be processed converted in the converting of the sizes of the first or second monitor pattern; and
forming a pattern having a space ratio of 1:1 on the film to be processed on the substrate, by performing the predetermined processes on the substrate under the compensated processing conditions.

2. The method of claim 1, wherein the target space ratio of the first monitor pattern or the second monitor pattern is determined based on a reproducibility of a distance between a center of a line portion and a center of a neighboring line portion and a reproducibility of sizes of the line portion in the first monitor pattern or in the second monitor pattern.

3. The method of claim 2, wherein the target space ratio of the first monitor pattern or the second monitor pattern is determined so that the reproducibility of the distance is 1.0 nm or less and the reproducibility of the size is 0.2 nm or less.

4. The method of claim 1, wherein in the trimming, the resist pattern is trimmed, and at the same time, an anti-reflection film formed between the film to be processed of the substrate and the resist pattern is etched by using the resist pattern as a mask.

5. The method of claim 1, wherein in the compensating for processing condition, processing conditions of the trimming are compensated for based on a difference between a width of a first space portion and a width of a second space portion in the converted sacrificial film pattern or the converted pattern of the film to be processed in the converting of the sizes.

6. The method of claim 1, wherein in the compensating for processing condition, processing conditions of the forming of the resist pattern are compensated for based on a difference between a width of a first space portion and a width of a second space portion in the converted sacrificial film pattern or the converted pattern of the film to be processed in the converting of the sizes.

7. The method of claim 6, wherein the processing condition compensated in the forming of the resist pattern is a processing condition of an exposure process in the photolithography process.

8. The method of claim 6, wherein the processing condition compensated in the forming of the resist pattern is a processing condition of a thermal process in the photolithography process.

9. The method of claim 8, wherein the thermal process is a heating process performed after the exposure process and before a developing process.

10. The method of claim 1, wherein in the compensating for processing condition, a processing condition of the forming of the sacrificial film is compensated for based on a line width of the line portion in the converted sacrificial film pattern or the converted pattern of the film to be processed in the converting of the sizes.

11. The method of claim 1, wherein in the compensating for processing condition, a processing condition of the forming of the film to be processed pattern is compensated for based on a line width of the line portion in the converted pattern of the film to be processed in the ratio converting of the sizes.

12. The method of claim 1, wherein in the compensating for processing condition, a processing condition of the forming of the film to be processed pattern is compensated for based on a difference between a width of a first space portion and a width of a second space portion in the converted sacrificial film pattern in the converting of the sizes.

13. A method of manufacturing a semiconductor device by performing predetermined processes on a substrate to form a pattern including line portions and space portions and having a space ratio of 1:1 between a width of a first space portion and a width of a second space portion that is adjacent to the first space portion on a film to be processed on the substrate, the method comprising:
    forming a monitor pattern, a target space ratio of which is different from a ratio of 1:1, by performing the predetermined processes on a substrate for inspection;
    measuring sizes of the monitor pattern, in a scatterometry method by using a library including patterns, wherein a range of space ratios of the library includes the target space ratio and does not include the space ratio of 1:1;
    converting the sizes of the monitor pattern, which are measured through the measuring of the sizes of the monitor pattern, into sizes of a pattern, a space ratio of which is aimed to be 1:1, by using a regression equation for converting the sizes of the monitor pattern having the target space ratio into sizes of a pattern having a space ratio of 1:1;
    compensating for processing conditions in the predetermined processes, based on the sizes of the pattern converted in the converting of the size; and
    forming a pattern having a space ratio of 1:1 on the film to be processed on the substrate, by performing the predetermined processes on the substrate under the compensated processing conditions.

14. The method of claim 13, wherein the target space ratio of the monitor pattern is determined based on a reproducibility of a distance between a center of a line portion and a center of a neighboring line portion and a reproducibility of sizes of the line portion in the monitor pattern.

15. The method of claim 14, wherein the target space ratio of the monitor pattern is determined so that the reproducibility of the distance is 1.0 nm or less and the reproducibility of the size is 0.2 nm or less.

16. A system for manufacturing a semiconductor device by performing predetermined processes on a substrate to form a pattern including line portions and space portions and having a space ratio of 1:1 between a width of a first space portion and a width of a second space portion that is adjacent to the first space portion on a film to be processed on the substrate, the system including:
    a processing unit comprising an applying and developing device and an exposure device which form a resist pattern including a plurality of lines on the film to be processed on the substrate by performing a photolithography process on the substrate, a trimming device which trims the resist pattern, a film forming device which forms a sacrificial film that functions as a mask when etching the film to be processed on the resist pattern, an ashing device which forms a pattern of the sacrificial film on the film to be processed on the substrate, wherein the pattern comprises a plurality of lines, by etching the sacrificial film so as to have the sacrificial film remain only on side wall portions of line portions of the resist pattern, and by removing the resist pattern, and an etching device which form a pattern including a plurality of lines on the film to be processed by etching the film to be processed by using the pattern of the sacrificial film as a mask, and performing the predetermined processes on the substrate;
    a pattern size measuring device which measures sizes of the pattern of the sacrificial film or the pattern of the film to be processed;
    a controlling device which compensates for processing conditions in the processing unit based on a result of measuring the sizes of the pattern of the sacrificial film or the pattern of the film to be processed,
    wherein the controlling device controls the processing unit to form a first monitor pattern formed on a sacrificial film of a substrate for inspection by the film forming device and to form a second monitor pattern formed on a film to be processed on the substrate for inspection by the etching device by performing predetermined processes on the substrate for inspection, wherein target space ratios of the first and second monitor patterns are different from a ratio of 1:1; controls the pattern size measuring device to measure sizes of the first monitor pattern or the second monitor pattern formed in the processing unit, in a scatterometry method by using a library including sacrificial film patterns or patterns of the film to be processed, wherein a range of space ratios of the library includes the target space ratio and does not include the space ratio of 1:1; converts the sizes of the first or second monitor pattern of the target space ratio, which are measured by the pattern size measuring device, into sizes of a sacrificial film pattern or a pattern of a film to be processed, a space ratio of which is aimed to be 1:1, by using a regression equation for converting the sizes of the first monitor pattern or the second monitor pattern having the target space ratio into sizes of a sacrificial film pattern or a pattern of a film to be processed having a space ratio of 1:1; and compensates for processing conditions in the processing unit based on the sizes of the converted sacrificial film pattern or the pattern of the film to be processed.

17. A system for manufacturing a semiconductor device by performing predetermined processes on a substrate to form a pattern including line portions and space portions and having a space ratio of 1:1 between a width of a first space portion and a width of a second space portion that is adjacent to the first space portion on a film to be processed on the substrate, the system comprising:
    a processing unit which forms a pattern by performing the predetermined processes on a substrate;
    a pattern size measuring device which measures sizes of the pattern formed by the processing unit; and
    a controlling device which compensates for processing conditions in the processing unit based on a result of measuring the sizes of the pattern,
    wherein the controlling device controls the processing unit to form a monitor pattern, a target space ratio of which is different from a ratio of 1:1, by performing the predetermined processes on a substrate for inspection; controls the pattern size measuring device to measure sizes of the monitor pattern formed by the processing unit, in a scatterometry method by using a library including patterns, wherein a range of space ratios of the library includes the target space ratio and does not include the space ratio of 1:1; converts the sizes of the monitor pattern, which are measured by the pattern size measuring device, into sizes of a pattern, a space ratio of which is aimed to be 1:1, by using a regression equation for converting the sizes of the monitor pattern having the target space ratio into sizes of a pattern having a space ratio of 1:1; and compensates for processing conditions in the processing unit, based on the converted sizes of the pattern.

* * * * *